United States Patent [19]
Higashino

[11] Patent Number: 5,844,256
[45] Date of Patent: Dec. 1, 1998

[54] SEMICONDUCTOR DEVICE COMPRISING POLYSILICON INTERCONNECTION LAYERS SEPARATED BY INSULATION FILMS

[75] Inventor: Tohru Higashino, Suwa, Japan

[73] Assignee: Seiko Epson Corporation, Tokyo, Japan

[21] Appl. No.: 750,628

[22] PCT Filed: Apr. 17, 1996

[86] PCT No.: PCT/JP96/01048

§ 371 Date: Dec. 11, 1996

§ 102(e) Date: Dec. 11, 1996

[87] PCT Pub. No.: WO96/33514

PCT Pub. Date: Oct. 24, 1996

[30] Foreign Application Priority Data

Apr. 17, 1995 [JP] Japan .................................. 7-091148
Dec. 18, 1995 [JP] Japan .................................. 7-329355

[51] Int. Cl.$^6$ .................................................. H01L 29/76
[52] U.S. Cl. .............................. 257/66; 257/67; 257/69; 257/756
[58] Field of Search ................................ 257/66, 67, 69, 257/756

[56] References Cited

U.S. PATENT DOCUMENTS 4,835,118  5/1989  Jones, Jr. et al. ........................ 437/173
5,289,404  2/1994  Okamoto .................................... 365/63
5,526,304  6/1996  Kawamura ............................... 365/154

FOREIGN PATENT DOCUMENTS 55-134962  10/1980  Japan .
3-70170    3/1991   Japan .
5-283651   10/1993  Japan .
6-244385   9/1994   Japan .
6-275724   9/1994   Japan .

Primary Examiner—Olik Chaudhuri
Assistant Examiner—Douglas A. Wille
Attorney, Agent, or Firm—Mark P. Watson

[57] ABSTRACT

In a micro-patterned semiconductor device that uses thin-film polycrystalline silicon for both interconnection and TFT (Thin Film Transistor) configuration elements, the required current supply capacity is achieved by increasing the leakage current of a reverse-direction diode when the reverse-direction junction diode is present in the current path consisting of polycrystalline silicon. Leakage current is increased by steepening the density slope at the PN junction of the diode which consists of polycrystalline silicon, or by making the region near the junction amorphous. For example, sufficient current can be supplied to a large number of memory cells via reverse-direction diodes even when cells that use TFTs consisting of thin-film polycrystalline silicon as the load for the flip-flop are used as large-scale SRAM memory cells. In this way, ultra high-integration memory ICs can be realized.

3 Claims, 22 Drawing Sheets

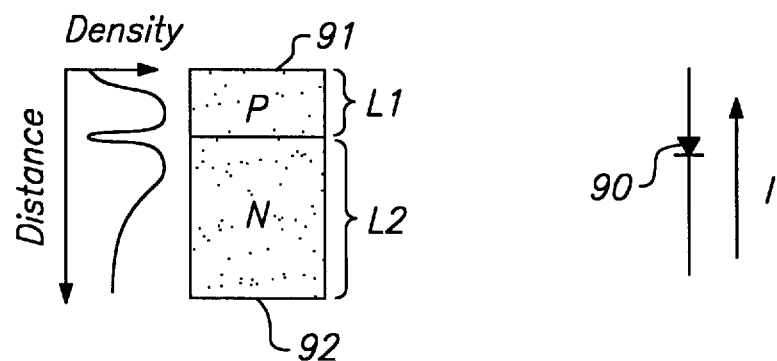
FIG._1A  FIG._1B
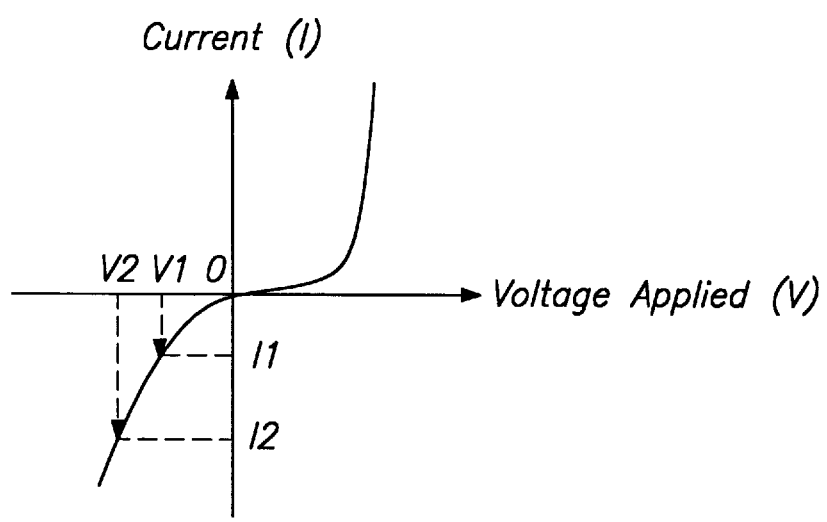
FIG._1C

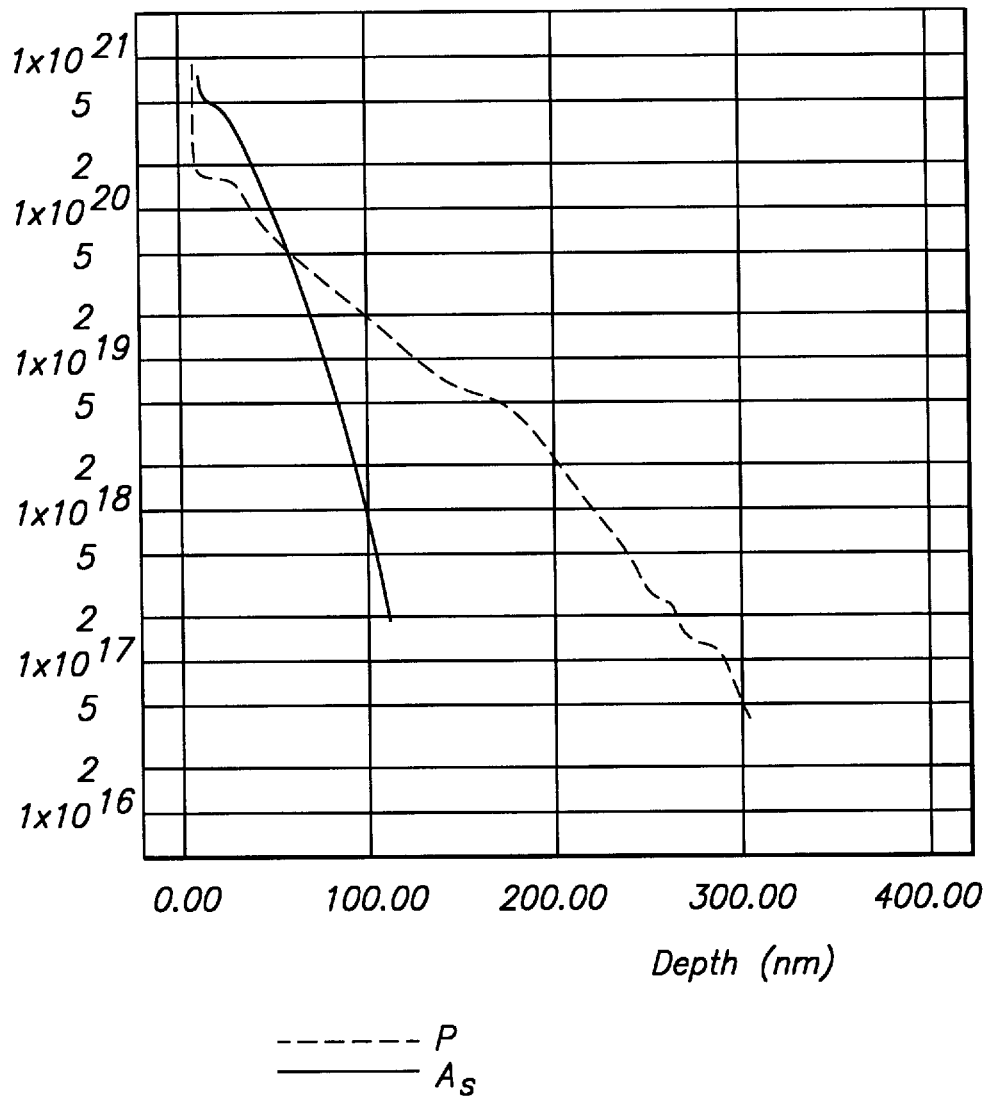
FIG._3

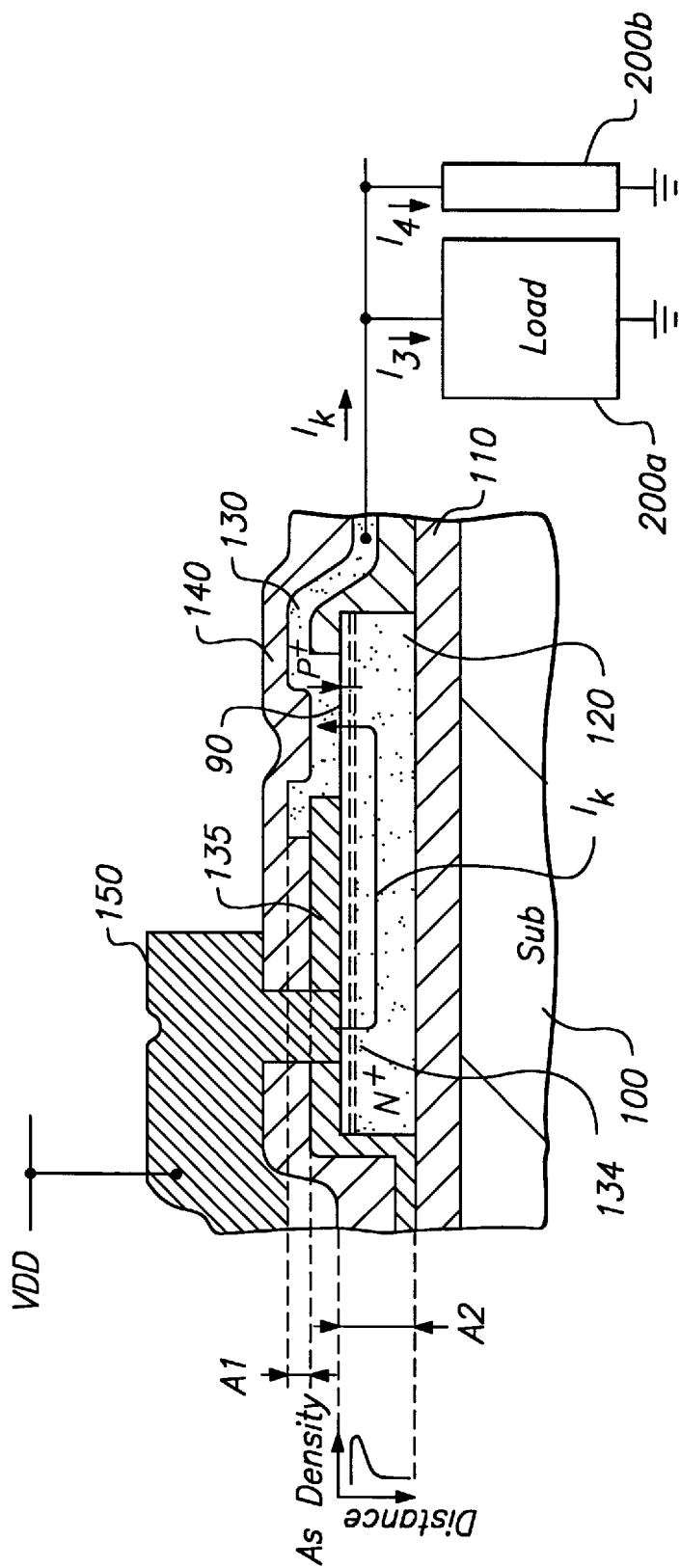
FIG._4

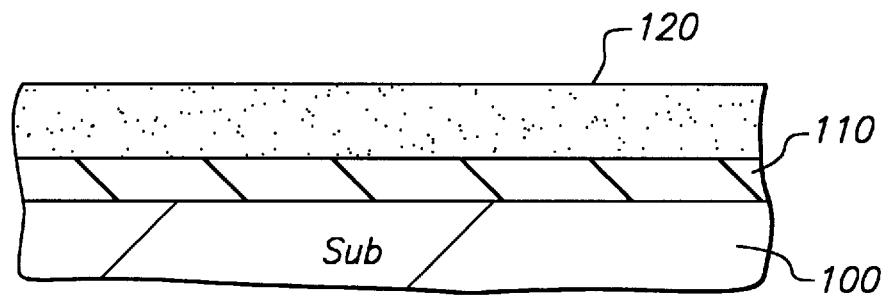
FIG._5
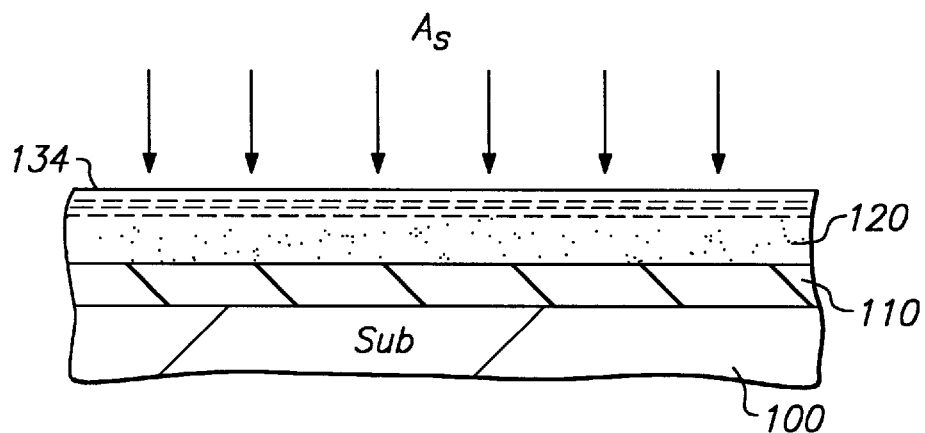
FIG._6
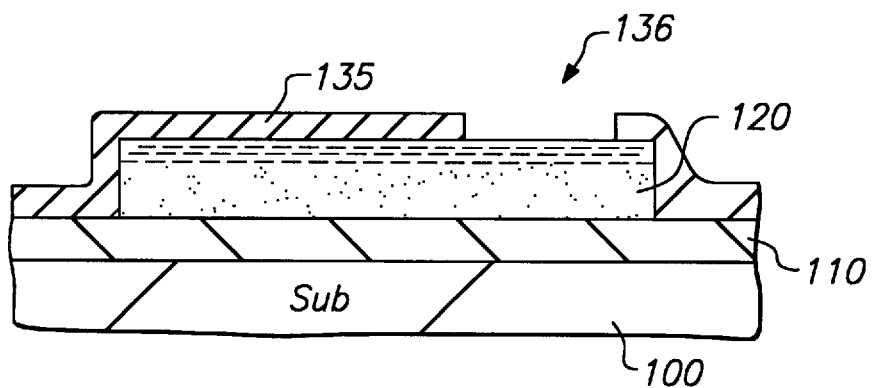
FIG._7

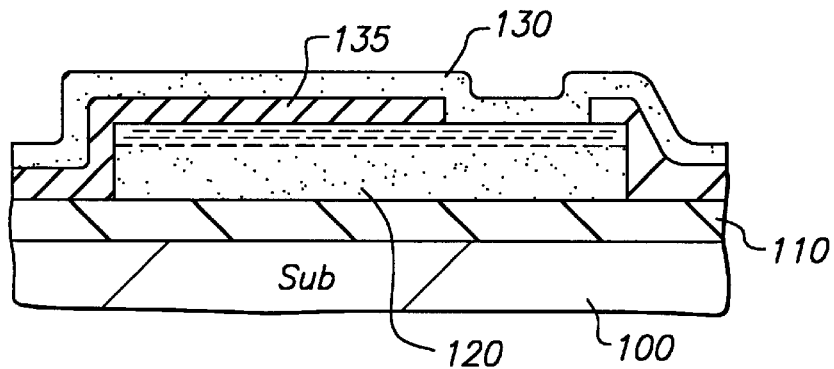
FIG._8
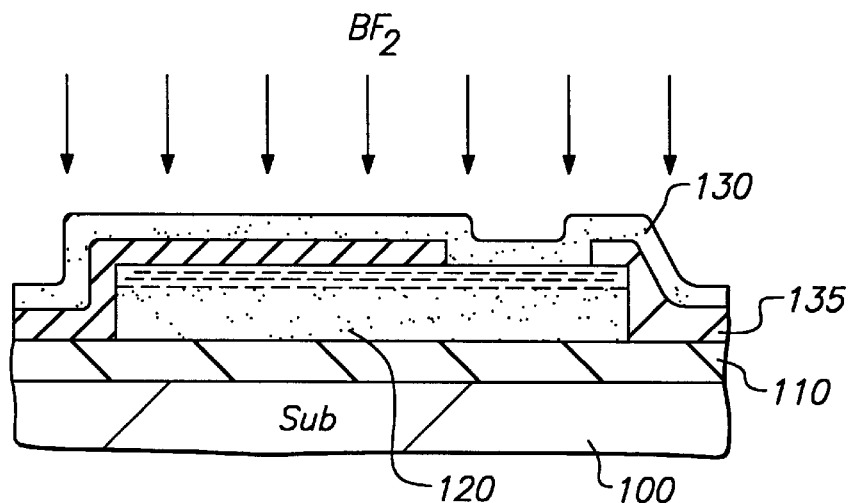
FIG._9
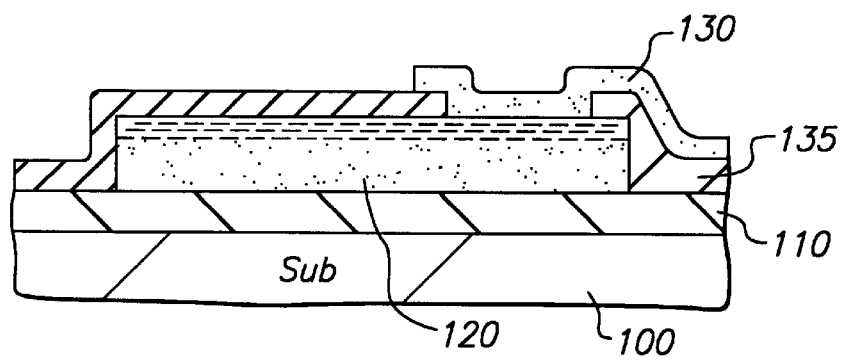
FIG._10

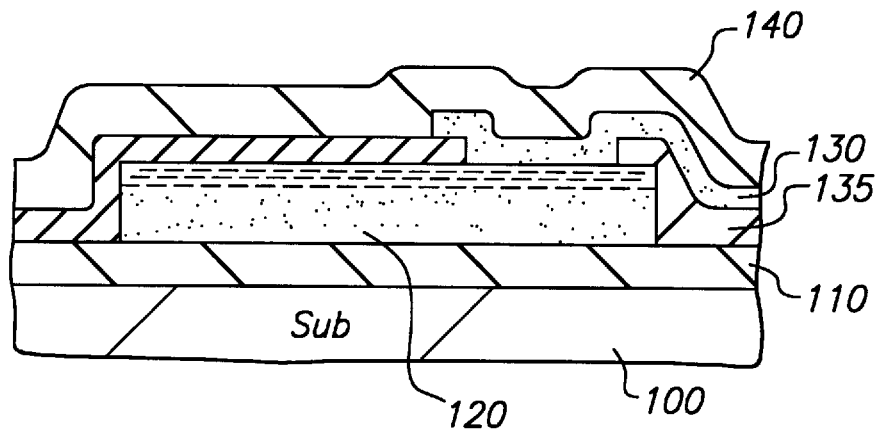
FIG._11
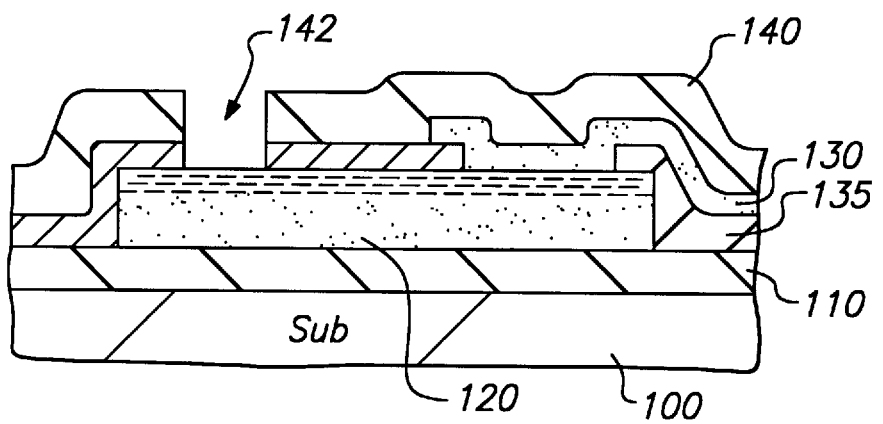
FIG._12

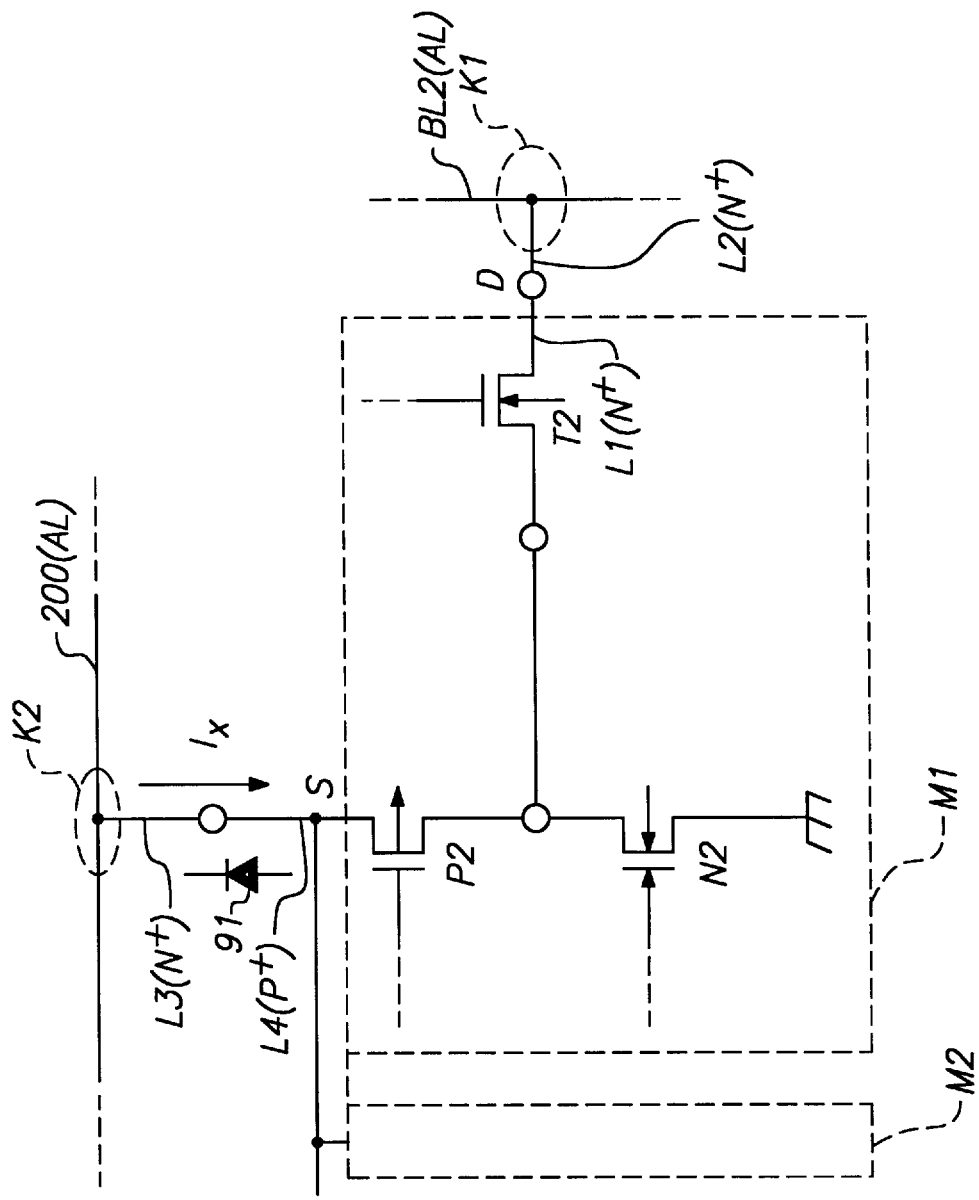
FIG._14

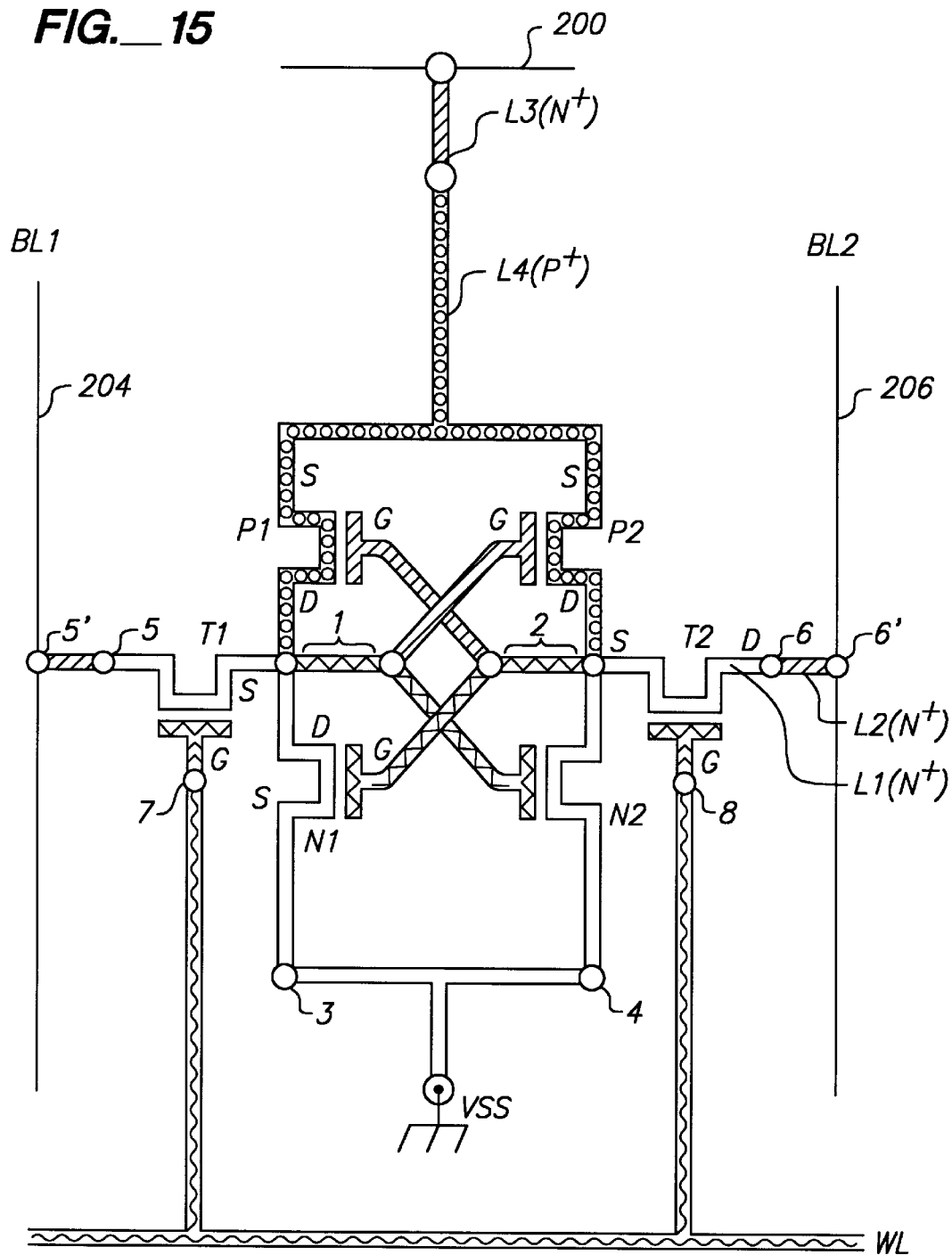
FIG._15

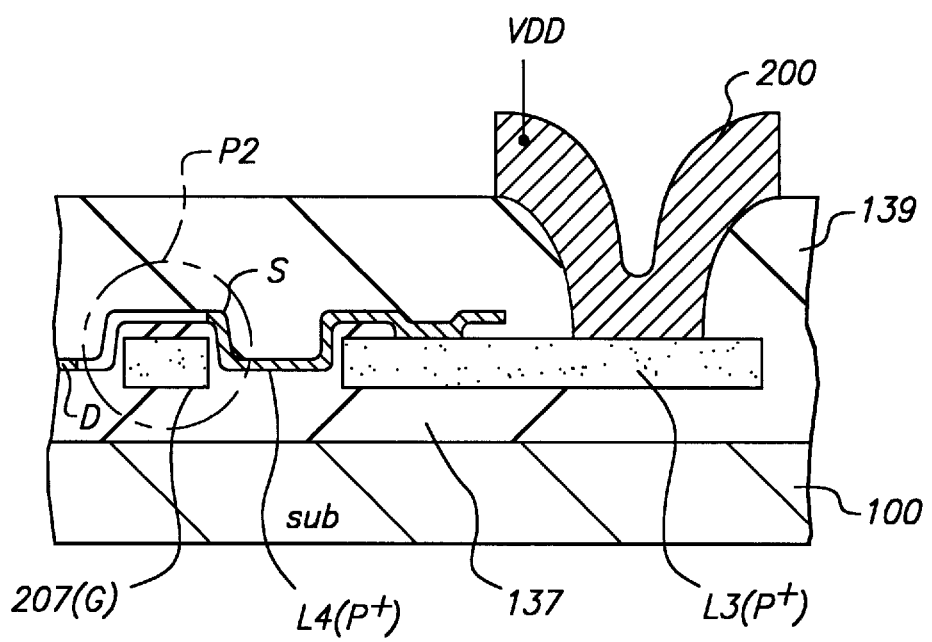
FIG._16

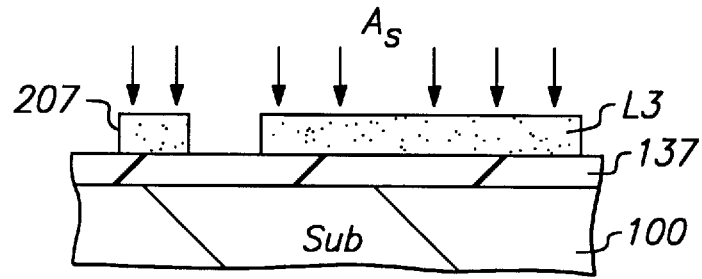
FIG._17A
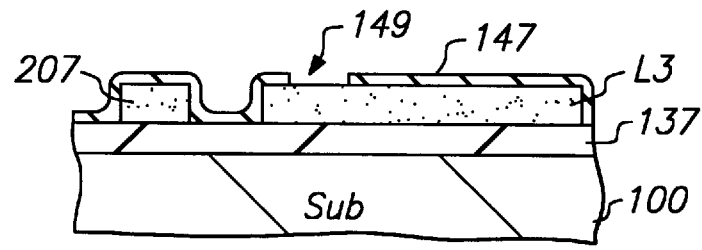
FIG._17B
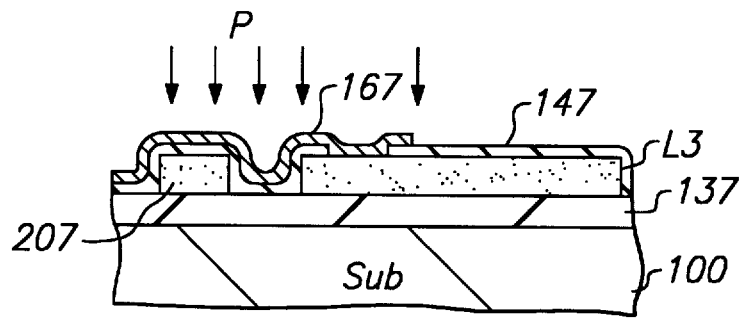
FIG._17C
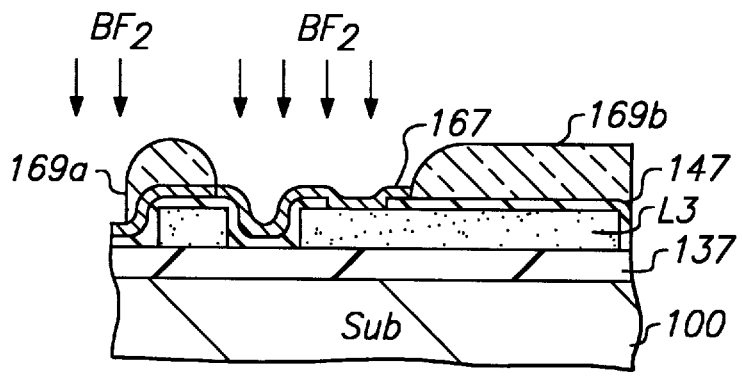
FIG._17D

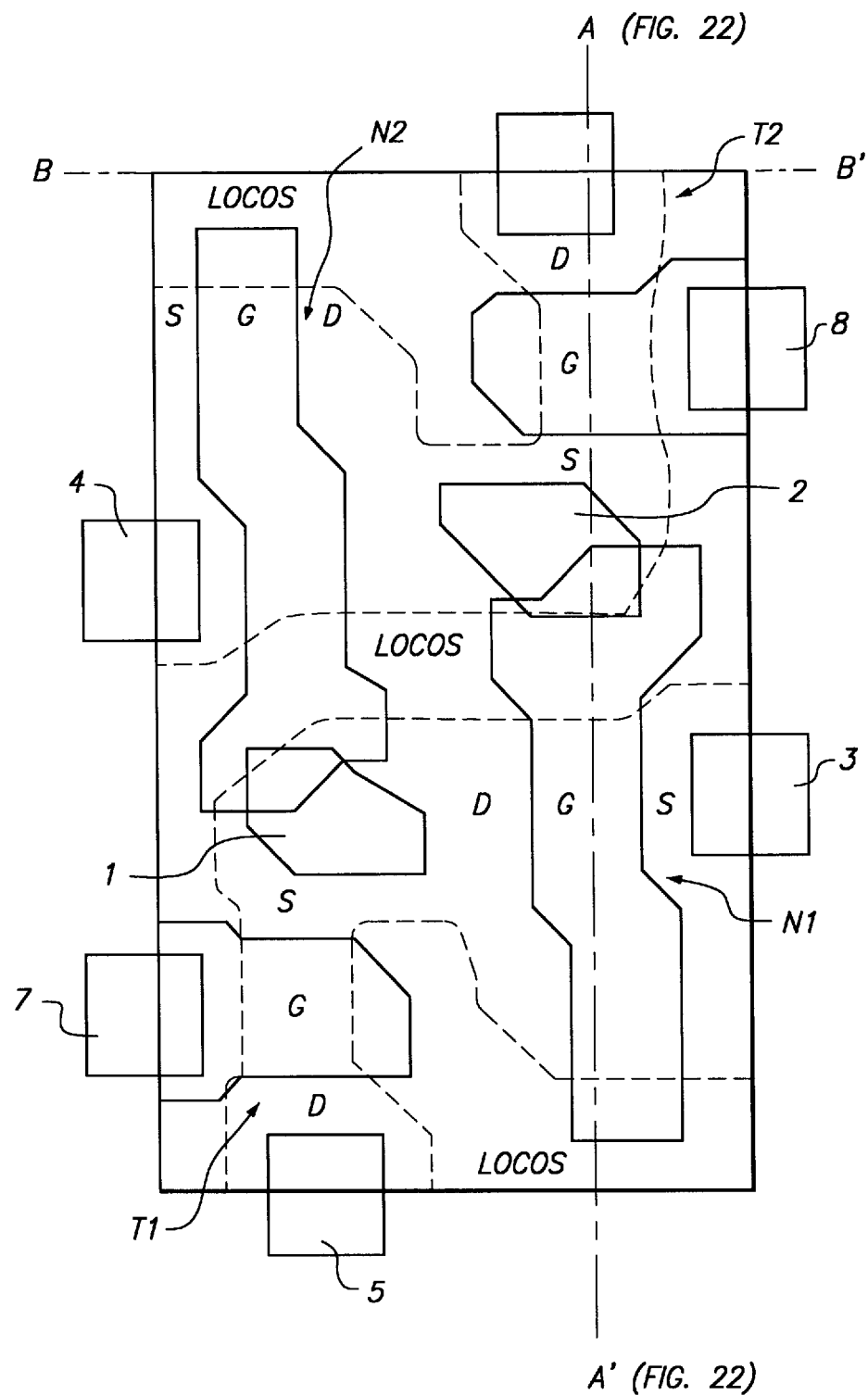
FIG._18

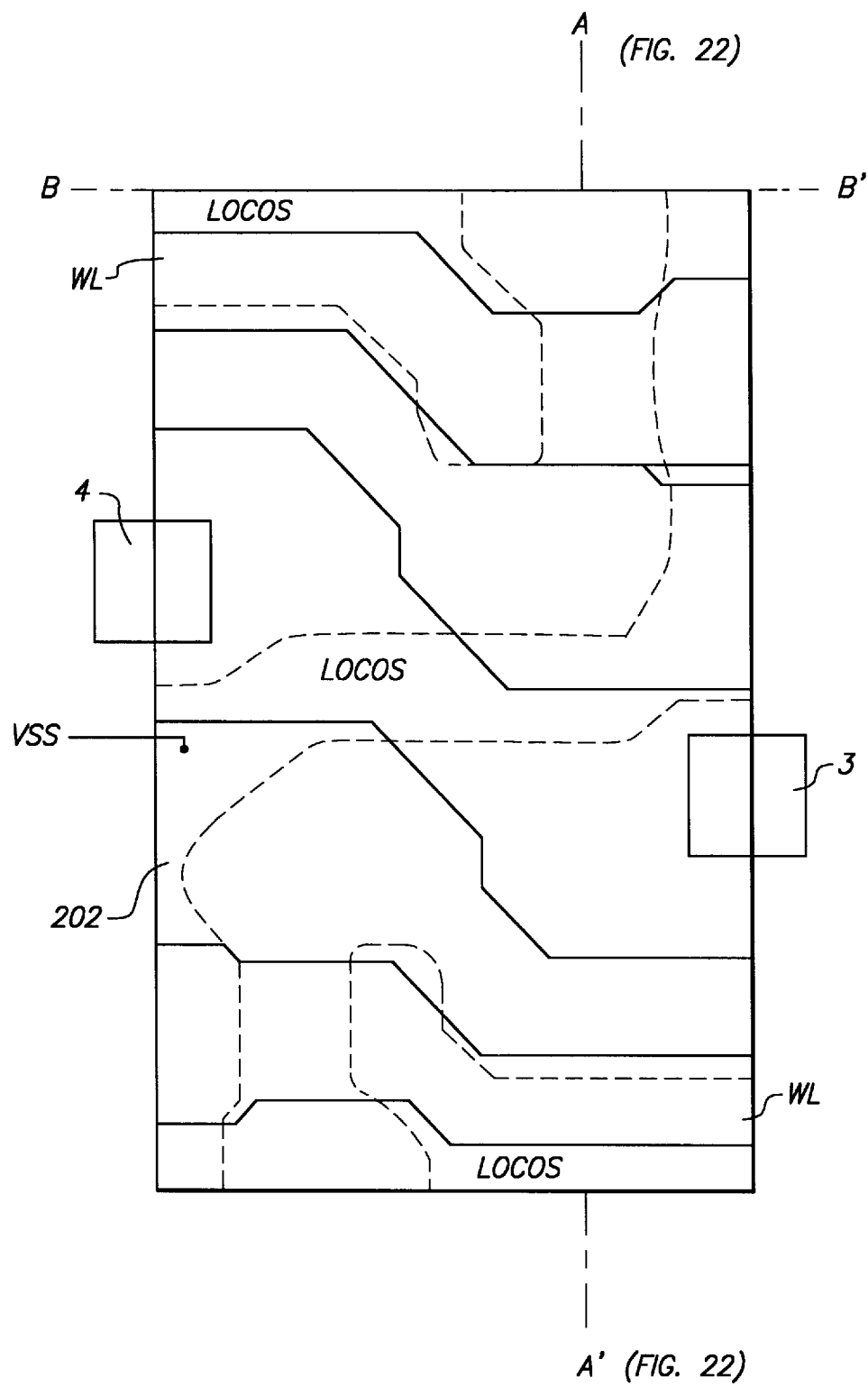
FIG._19

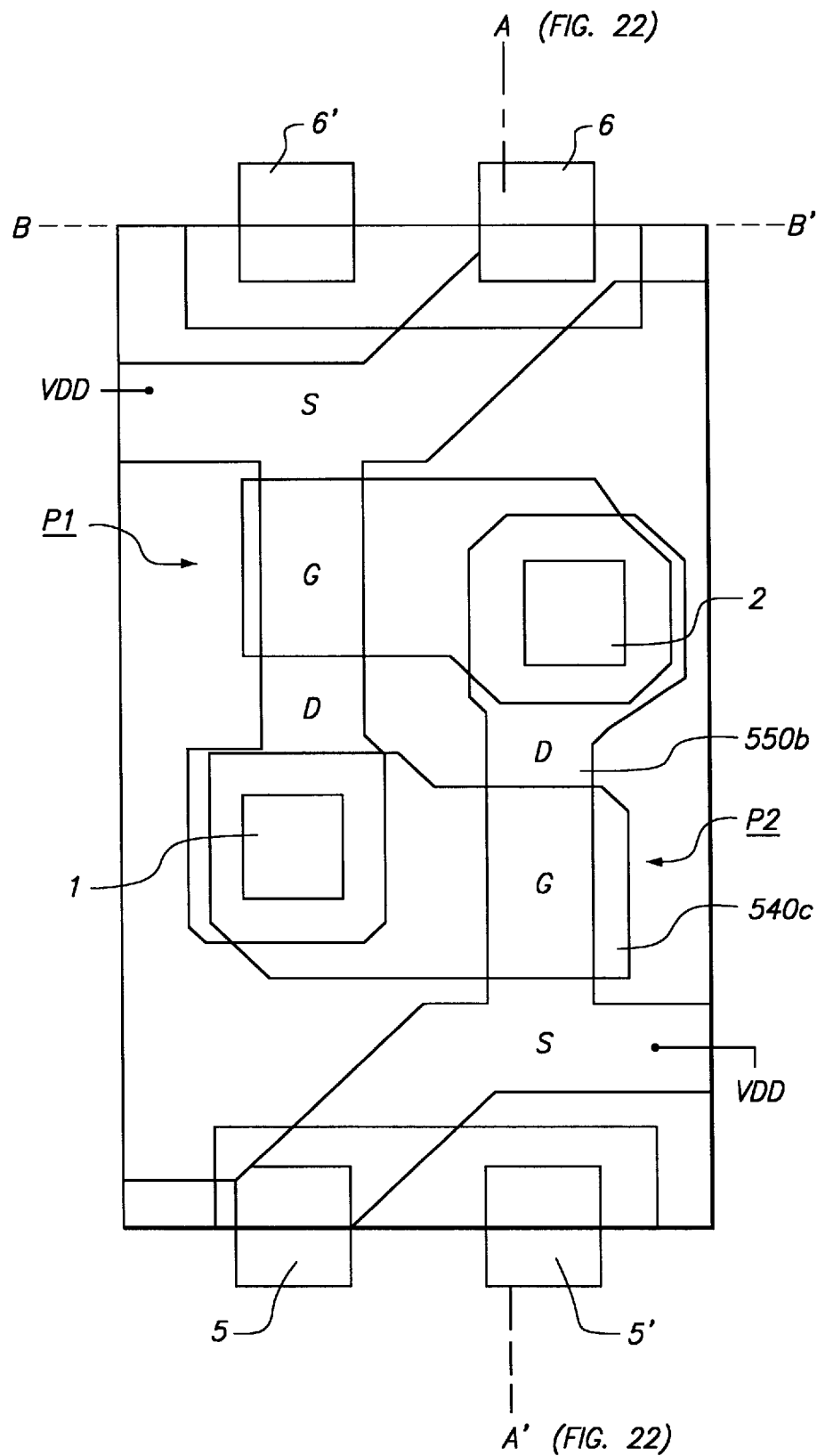
FIG._20

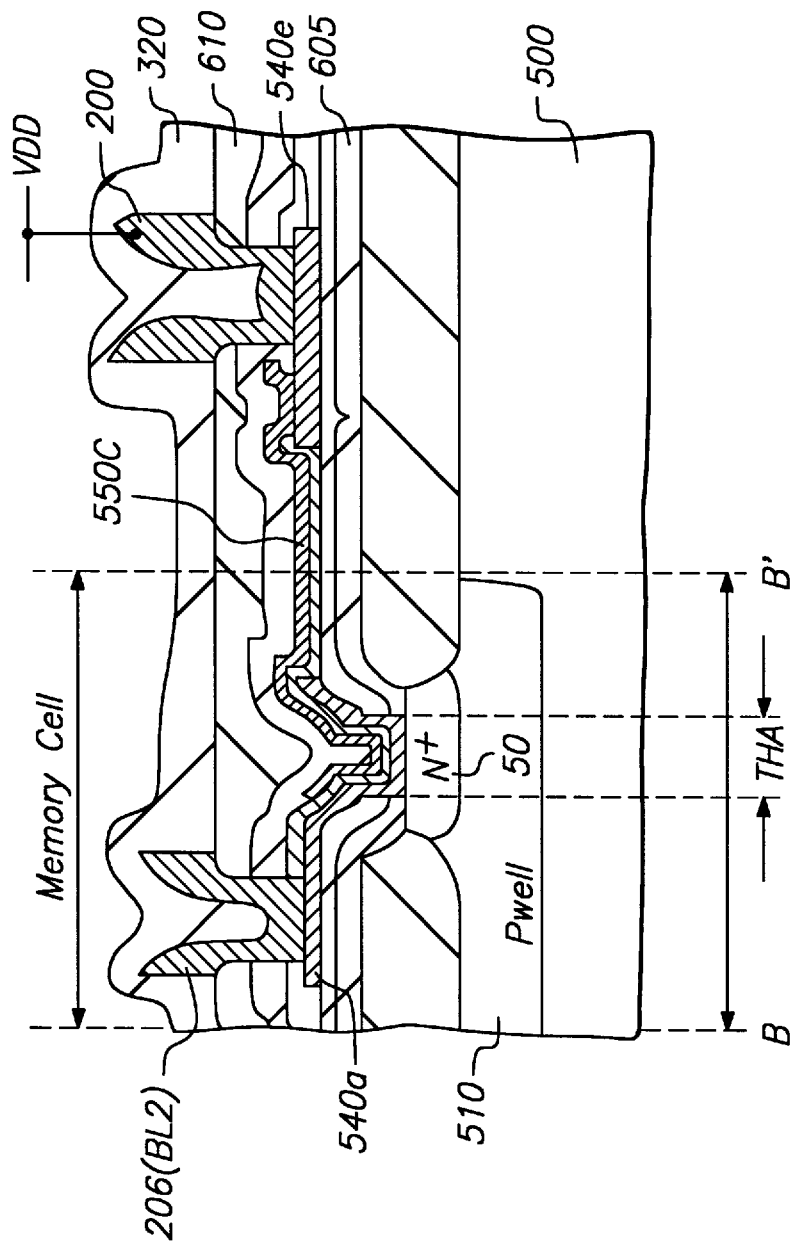
FIG._23

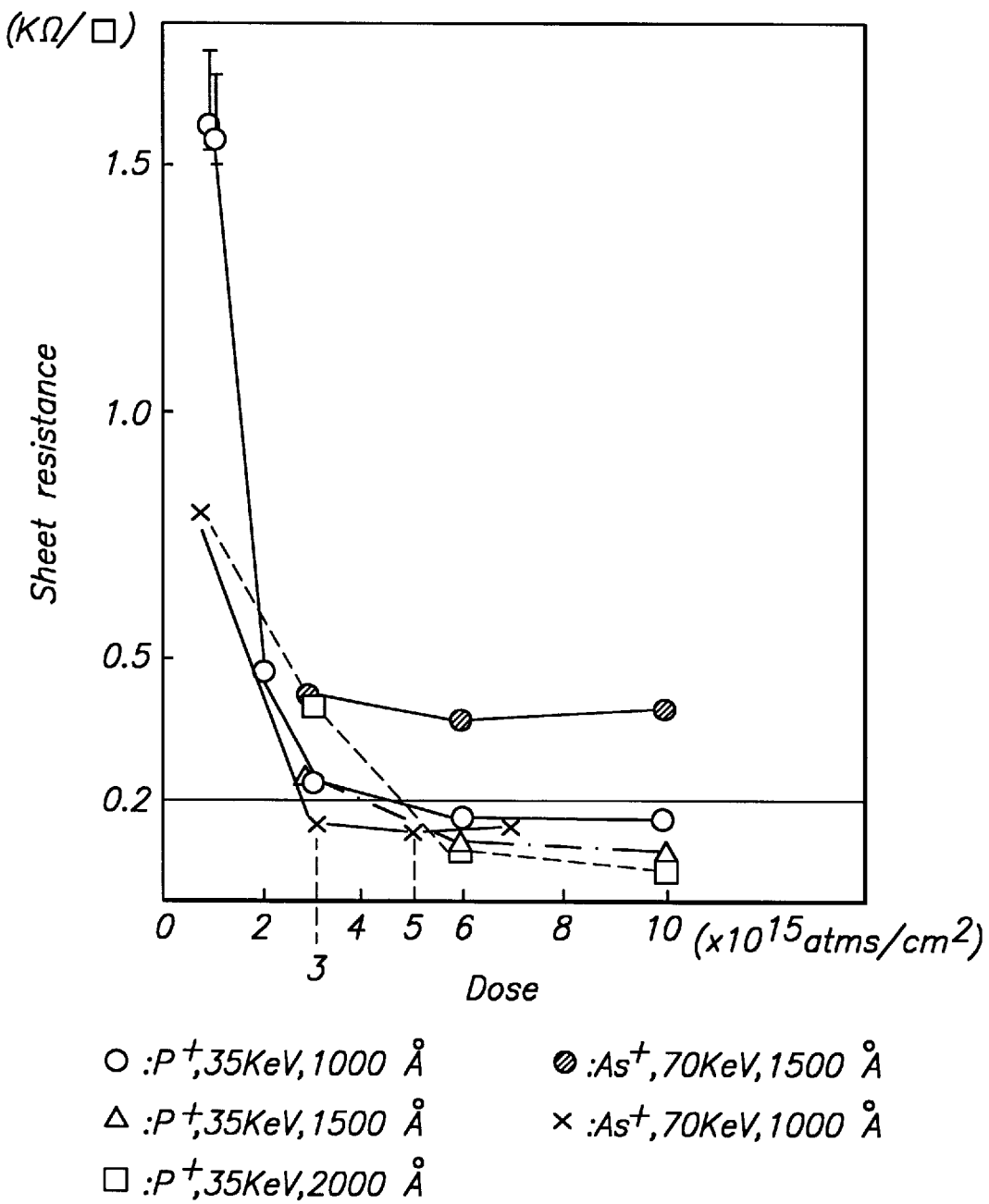
FIG._24

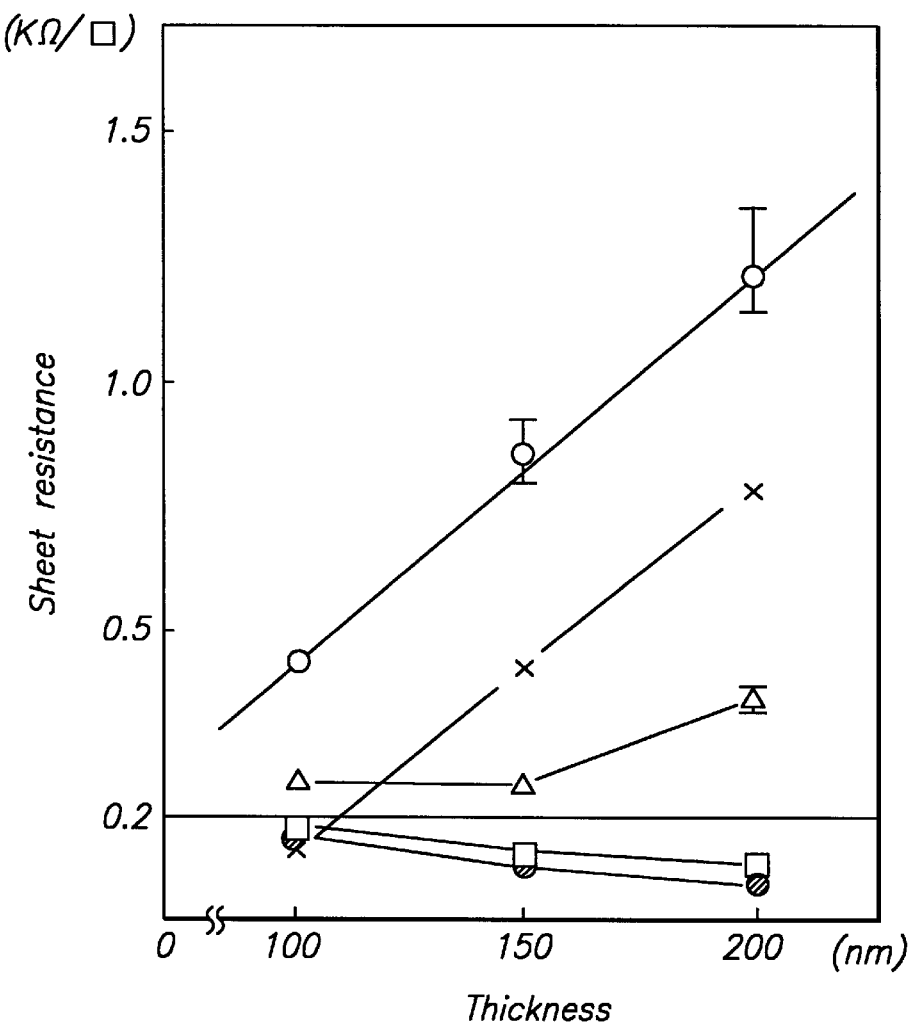
FIG._25

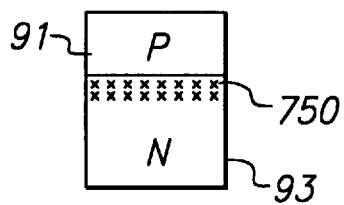
FIG._26A
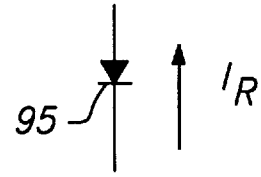
FIG._26B
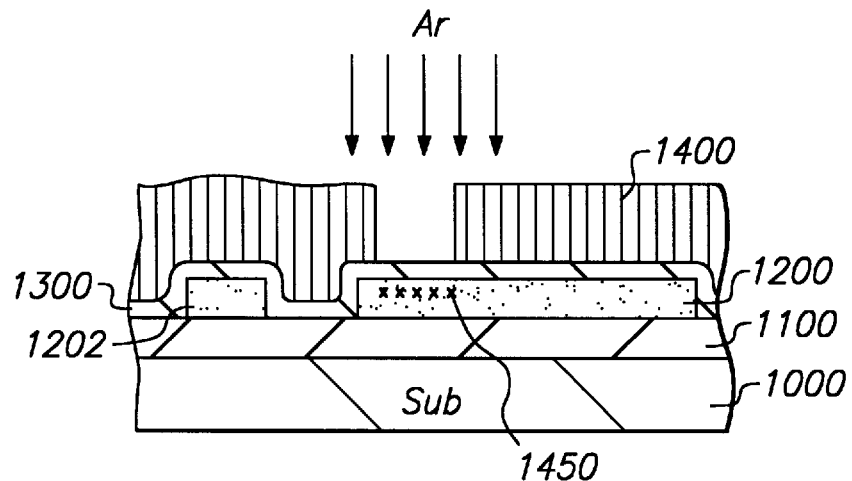
FIG._27
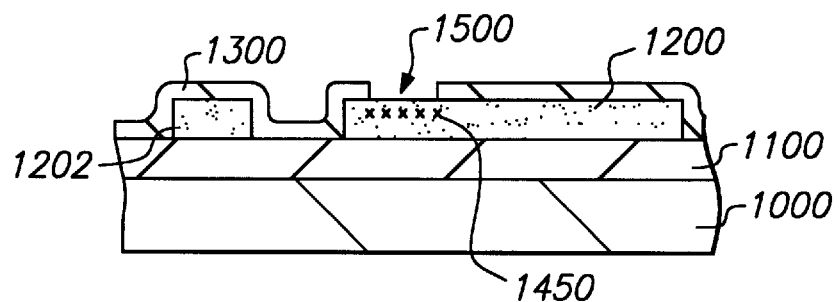
FIG._28

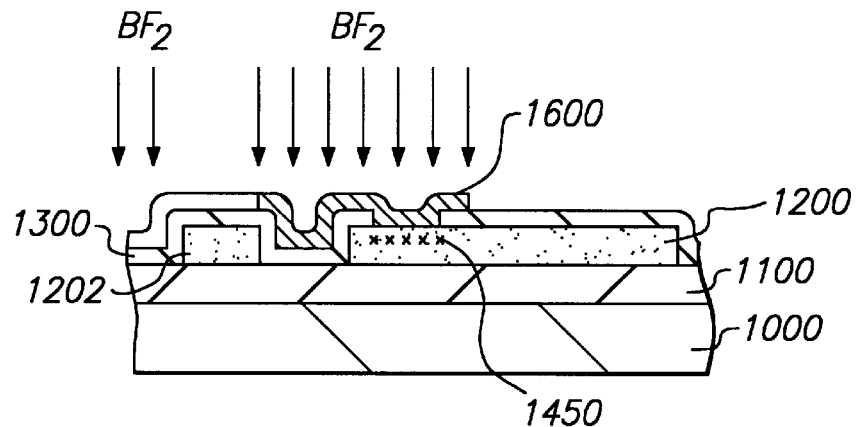
FIG._29
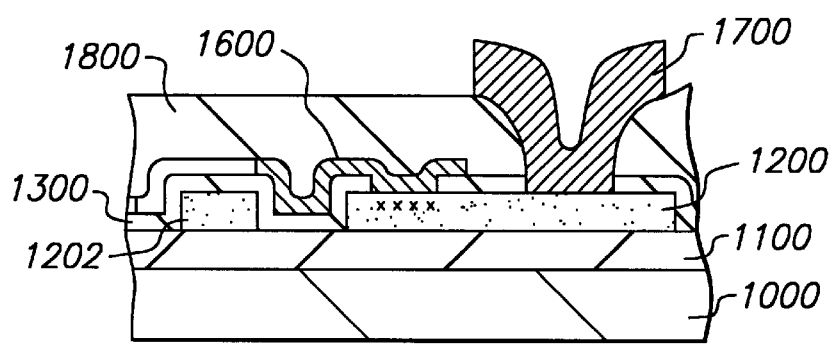
FIG._30
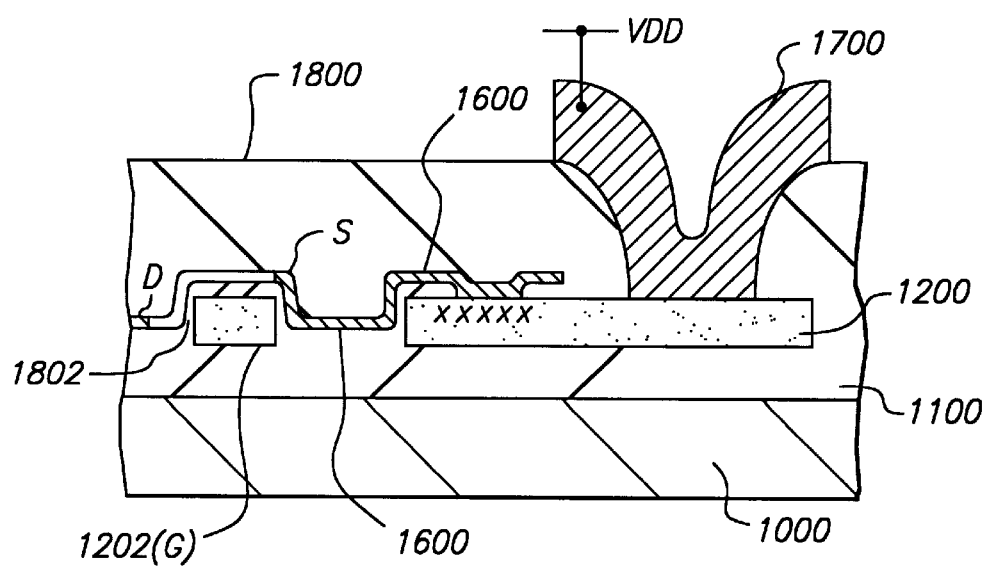
FIG._31

SEMICONDUCTOR DEVICE COMPRISING POLYSILICON INTERCONNECTION LAYERS SEPARATED BY INSULATION FILMS

This application is a 371 of PCT/JP96/01048 filed Apr. 17, 1996.

BACKGROUND OF THE INVENTION

1. Field of the Invention

This invention relates generally to a semiconductor device and the manufacturing method thereof; and more particularly to an ultra LSI device equipped with a multi-layer interconnection structure configured by layering polycrystalline silicon interconnection layers separated by layers of insulation films, and the manufacturing method thereof.

2. Description of the Related Art

A memory cell of static random access memory (SRAM) usually consists of a pair of MOS transistors that form a flip-flop, two MOS transistors (transfer gates) that control the connection/disconnection of the output terminal and the data line, and two resistors that act as the load for the flip-flop.

However, as the integration level of SRAM has increased in recent years, SRAM is beginning to use memory cells in which the two resistors that act as the load for the flip-flop are replaced by two MOS transistors configured using thin polycrystalline silicon films. A single memory cell is thereby configured using six MOS transistors.

A MOS transistor (Thin Film Transistor: TFT) formed using thin polycrystalline silicon films is created by forming the source and drain layers by selectively introducing impurities into the polycrystalline silicon films formed on layer insulating films. Polycrystalline silicon films are also used as interconnection layers.

In other words, multi-layer thin-film polycrystalline silicon can be used for both interconnection and TFT configuration elements.

However, in LSI manufacturing, it is best to use common manufacturing processes as much as possible in order to reduce the number of process steps required. The inventor has discovered that when microcircuits are formed using the above-mentioned multi-layer thin-film polycrystalline silicon for both interconnection and TFT configuration elements using common manufacturing processes, an undesirable reverse-direction diode may sometimes be present in the current path.

In such case, the reverse-direction diode present in the current path interferes with the current supply, thus adversely affecting the circuit characteristics. Therefore, it is necessary to supply the current required for achieving the desired circuit characteristics by increasing the leakage current of the reverse-direction diode.

However, the reverse-direction diode consists of a polycrystalline silicon PN junction, and since no analysis had been performed on the leakage current characteristics of such a PN junction, no appropriate method was available for increasing the leakage current.

Therefore, one of the objects of the present invention is to successfully develop basic semiconductor manufacturing technology for achieving the required current supply capacity by increasing the amount of diode leakage current, i.e., the current that flows in the reverse direction, when a polycrystalline silicon PN junction diode (reverse-direction diode) is present in the current path. Another object of the present invention is to provide a highly-integrated, high-performance semiconductor device.

SUMMARY OF THE INVENTION

The present invention achieves the required current supply capacity by increasing the leakage current of a reverse-direction diode when the reverse-direction junction diode is present in the current path consisting of polycrystalline silicon, in a micro-patterned semiconductor device that uses thin-film polycrystalline silicon for both interconnection and TFT (Thin Film Transistor) configuration elements. Leakage current is increased by steepening the density slope at the PN junction of the diode which consists of polycrystalline silicon, or by making the region near the junction amorphous.

For example, sufficient current can be supplied to a large number of memory cells via reverse-direction diodes even when cells that use TFTs consisting of thin-film polycrystalline silicon as the load for the flip-flop are used as large-scale SRAM memory cells. In this way, ultra high-integration memory ICs can be realized.

The semiconductor device according to the present invention possesses PN junction diodes that consist of a first conductive type first polycrystalline silicon layer possessing a certain thickness and a second conductive type second polycrystalline silicon layer that is connected to and thinner than the first polycrystalline silicon layer; and the density distribution of the first conductive type impurities within the first polycrystalline silicon layer, in the thickness direction, possesses a peak near the junction with the second polycrystalline silicon.

In a polycrystalline silicon PN-junction diode, when the density slope at the junction becomes steep, leakage current abruptly increases as reverse-bias voltage increases. Using this phenomenon to cause a large amount of leakage current in the PN-junction diode, the required current is supplied to the load circuit.

In one of the preferred embodiments of the present invention, a conductive layer for supplying current (voltage) is connected to a thick N-type layer, a thin P-type layer is connected to this N-type layer, and a load circuit is formed in this P-type layer.

Since the N-type layer is thick, excellent electrical connection with the conductive layer can be achieved.

In a preferred embodiment of the present invention, arsenic (As) is used as the N-type dopant for the polycrystalline silicon layer.

A preferred embodiment of the manufacturing method of the semiconductor device of the present invention comprises;

a process. for forming a first insulation layer on a semiconductor substrate; a process for forming a non-doped first polycrystalline silicon layer possessing a specified thickness on the first insulation layer; a process for implanting N-type impurities into the first polycrystalline silicon layer such that the density distribution of the impurities within the first polycrystalline silicon layer, in the thickness direction, possesses a peak near the surface of the first polycrystalline silicon layer; a process for forming a second insulation layer on the first polycrystalline silicon layer; a process for exposing part of the surface of the first polycrystalline silicon layer by forming an opening in part of the second insulation layer; a process for forming a second polycrystalline silicon layer, on the second insulation layer, that is connected to the first polycrystalline silicon layer through the opening, that is thinner than the first polycrystalline silicon, and that is a P-type; a process for forming a third insulation layer on the second polycrystalline silicon layer; a process for exposing the surface of the first polycrystalline silicon layer by forming an opening through the second and third insulation layers; and a process for forming a conductive layer, on the third insulation layer, that is connected to the first polycrystalline silicon layer through the opening that goes through both the second and third insulation layers.

Since impurities are introduced into the non-doped polycrystalline silicon layer through ion implantation, the impurity density can be precisely controlled to peak near the surface of the polycrystalline silicon layer. Consequently, the slope of the impurity density at the junction of the PN junction diode becomes steep, increasing the leakage current.

In another preferred embodiment of the present invention, the thickness of the thick polycrystalline silicon layer is in the range of 100 to 200 nm, the acceleration voltage energy used for implanting arsenic (As) ions into the thick polycrystalline silicon layer is from 40 to 70 KeV, and the dose is in the range of $3\times10^{15}$ atms/cm$^2$ to $1\times10^{16}$ atms/cm$^2$.

One of the preferred embodiments of the semiconductor device of the present invention comprises;

a first insulation layer provided on a semiconductor substrate; an N-type first polycrystalline silicon layer that is formed on the first insulation layer that possesses a specified thickness and selective parts of whose surface are amorphous; a second insulation layer that is formed on the first polycrystalline silicon layer, and on which openings are provided in locations that correspond to the regions of the first polycrystalline silicon layer that are amorphous as described above; a P-type second polycrystalline silicon layer that is formed on the second insulation layer, that is connected to the first polycrystalline silicon layer through the openings, and that is thinner than the first polycrystalline silicon layer; a third insulation layer formed on the second polycrystalline silicon layer; a conductive layer that is formed on the third insulation layer, and that is connected to the first polycrystalline silicon layer through the opening that has been formed through both the second and third insulation layers; and a load circuit that is electrically connected to the second polycrystalline silicon layer; wherein current is supplied from the conductive layer to the load circuit via the reverse-direction junction diode formed by the first and the second polycrystalline silicon layers.

Leakage current increases when the region near the junction of the polycrystalline PN junction diode is made amorphous.

An amorphous state can be achieved near the junction of the PN junction diode through selective high-density ion implantation into the polycrystalline silicon layer. The ion implantation dose into the polycrystalline silicon layer is preferably at least $1\times10^{15}$ atms/cm$^2$.

Another preferred embodiment of the semiconductor device of the present invention comprises;

multiple pairs of bit lines, multiple memory cells that are connected between the individual pairs of bit lines and that are driven by a common word line, a common current path for supplying current to the multiple memory cells, and a reverse-direction diode that exists in the common current path; wherein the reverse-direction diode is a junction diode formed by connecting different kinds of conductive-type polycrystalline silicon.

Still another preferred embodiment of the semiconductor device of the present invention comprises;

multiple pairs of bit lines, multiple memory cells that are connected between the individual pairs of bit lines and that are driven by a common word line, a power supply line for supplying power supply voltage to the multiple memory cells, a common current path that is connected to the power supply line and that supplies current to the multiple memory cells, a reverse-direction diode that exists in the common current path, and an interconnection layer that connects the common current path with the memory cells;

wherein one of the memory cells comprises a pair of N-type insulation gate field effect transistors that constitute a flip-flop, a pair of N-type insulation gate field effect transistors that constitute a transfer gate provided between the two output terminals of the flip-flop and a pair of bit lines, a pair of P-type insulation gate field effect transistors that constitute the load of the flip-flop and that are provided between the common connection point between the output terminals of the flip-flop and the insulation gate field effect transistors that constitute the transfer gate, and the power supply line;

wherein the source layer and the drain layer of the pair of N-type insulation gate field effect transistors that constitute the flip-flop, and the source layer and the drain layer of the pair of N-type insulation gate field effect transistors that constitute the transfer gate are impurity layers formed inside a semiconductor substrate;

wherein the source (S) and the drain (D) of the pair of P-type insulation gate field effect transistors that constitute the load of the flip-flop comprise the n-th P-type polycrystalline silicon layer (where n is an integer of at least 2) formed on a semiconductor substrate, and the n-th P-type polycrystalline silicon layer that exists continuously to the source (S) acts both as the interconnection between the common current path and each of the memory cells and as the interconnection that constitutes part of the common current supply path;

wherein the pair of bit lines and the common current path are located in conductive layers both of which are higher than the n-th polycrystalline silicon layer;

wherein the pair of bit lines and the drain layer of the N type insulation gate field effect transistors that constitute the transfer gate are mutually connected by the first relay line that is formed using the (n–1)-th N-type polycrystalline silicon layer;

wherein the n-th P-type polycrystalline silicon layer that acts as the interconnection and the power supply line are mutually connected by the second relay line that is formed using the (n–1)-th N-type polycrystalline silicon layer, and thus forming a reverse-direction diode inside the common current path;

wherein the thickness of the (n–1)-th N-type polycrystalline silicon layer that constitutes the second relay line is thicker than the thickness of the n-th P-type polycrystalline silicon layer that acts as the interconnection; and wherein the density distribution of the N-type impurities in the thickness direction in the region, in which the reverse-direction diode is formed, of the (n–1)-th N-type polycrystalline silicon layer that constitutes the second relay line possesses a peak near the junction of the reverse-direction diode.

In SRAM memory cells, bit lines and power supply lines are the top-most interconnection lines consisting of a thick conductive layer such as aluminum, and it is difficult to directly connect these interconnection lines to transistor Therefore, bit lines and power supply lines are first connected to the relay line consisting of the thick (N–1)-th polycrystalline silicon layer and this relay line is then connected to the transistors. In this way, the connection structure from the bit lines and power supply lines to the transistors are standardized, thus simplifing the manufacturing process.

In this case, if the conductive type of the transistors to be connected to the bit lines is different from the conductive type of the transistors to be connected to the power supply lines, a reverse-direction diode will be present in the connection path of either of the lines. However, the leakage current of the diode is increased through the steep impurity density distribution at the junction, enabling the supply of sufficient current even in this case.

In one of the preferred embodiments of the present invention, arsenic (As) is preferably used as the N-type impurity for the (n–1)-th N-type polycrystalline silicon layer that constitutes the relay line.

In another preferred embodiment of the present invention, the acceleration voltage energy used for implanting arsenic (As) ions into the (n–1)-th N-type polycrystalline silicon layer that constitutes the relay line is preferably from 40 to 70 KeV, and the dose is in the range of $3 \times 10^{15}$ atms/cm$^2$ to $1 \times 10^{16}$ atms/cm$^2$.

In still another preferred embodiment of the present invention, the thickness of the (n–1)-th N-type polycrystalline silicon layer that constitutes the relay line is in the range of 100 to 200 nm, and the thickness of the n-th P-type polycrystalline silicon layer is equal to or less than one half the thickness of the (n–1)-th N-type polycrystalline silicon layer that constitutes the relay line.

The n-th P-type polycrystalline silicon layer cannot be made too thick because the multi-layer interconnection lines must be kept flat. On the other hand, in order to maintain processing accuracy and to reduce interconnection resistance, the (n–1)-th N-type polycrystalline silicon layer that constitutes the relay line cannot be made too thin. Therefore, the (n–1)-th N-type polycrystalline silicon layer that constitutes the relay line is at least twice as thick as the n-th P-type polycrystalline silicon layer.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts

FIG. 1A explains the characteristics of an example of a PN junction diode that consists of polycrystalline silicon and that is used in the semiconductor device according to the present invention; FIG. 1B is an equivalent circuit of the diode shown in FIG. 1A; and FIG. 1C shows the voltage and current characteristics of the diode shown in FIG. 1A and FIG. 1B.

FIG. 3 shows the density distribution of phosphorus (P) and arsenic (As) after ion implantation within a polycrystalline silicon layer.

FIG. 4 is a device cross-section showing a configuration example of the major area of the semiconductor device according to the present invention; and FIG. 5 through FIG. 12 are device cross-sections each showing an example of the manufacturing method for the semiconductor device shown in FIG. 4.

FIG. 14 shows the key areas of the SRAM shown in FIG. 13;

FIG. 15 explains the layers that constitute an SRAM memory cell;

FIG. 16 is a cross-section showing part of the structure of the SRAM shown in FIG. 13;

FIG. 17A is a device cross-section showing the first process for manufacturing the device shown in FIG. 16; FIG. 17B is a device cross-section showing the second process; FIG. 17C is a device cross-section showing the third process; FIG. 17D is a device cross-section showing the fourth process;

FIG. 18 through FIG. 21 show the layout patterns for each of the manufacturing processes for SRAM memory cells;

FIG. 23 is a cross-section along line B–B' of the memory cell following the completion of the process shown in FIG. 21;

FIG. 24 shows the relationship between the amount (dose) of ion implanted into the polycrystalline silicon layer and the sheet resistance;

FIG. 25 shows the relationship between the thickness of the polycrystalline silicon layer and the sheet resistance;

FIG. 26A explains the characteristics of another example of a PN junction diode that consists of polycrystalline silicon and that is used in the semiconductor device according to the present invention; FIG. 26B is an equivalent circuit of the diode shown in FIG. 26A;

FIG. 27 through FIG. 30 are device cross-sections for explaining another example of the manufacturing method for the semiconductor device according to the present invention; and FIG. 31 shows an example of the cross-sectional structure of the semiconductor device possessing a multi-layer structure, manufactured using the manufacturing method shown in FIG. 27 through FIG. 30.

DESCRIPTION OF THE PREFERRED EMBODIMENTS

The semiconductor device according to the present invention is provided with PN junction diode 90 (see FIG. 1B) formed by joining different conductive type polycrystalline silicon layers 91 and 92 shown in FIG. 1A. Current is supplied from the power supply to the load circuit using the large leakage current I of this PN junction diode.

Layer thickness L1 of P-type polycrystalline silicon layer 91 is thin, and layer thickness L2 of N-type polycrystalline silicon layer 92 is thick, whereby relationship $L1 \leq (1/2).L2$ holds. Furthermore, the impurity density near the junction is high, and as shown on the left side of FIG. 1A, the impurity density in both polycrystalline silicon layers 91 and 92 is designed to peak near the junction.

If the P-type impurity density distribution in the thickness direction cannot be accurately controlled because the layer thickness L1 of the P-type polycrystalline silicon layer 91 is too thin, it is particularly important to increase the density of the N-type impurity in thick N-type polycrystalline silicon layer 92 near the junction.

According to the evaluation made by the inventor, the leakage current of the polycrystalline silicon junction diode increases when the impurity density is high near the junction and the impurity density slope is steep, thereby resulting in a leaky diode. FIG. 1C shows the voltage and current characteristics of a polycrystalline silicon junction diode possessing steep density slope. As is clear from this figure, when the reverse voltage is increased from V1 to V2, for example, leakage current abruptly increases from I1 to I2. In other words, the diode is always in a kind of break-down state, which will be referred to as "soft break-down state" in this specification.

Leakage current characteristics that depend on the impurity density near the junction are not observed in ordinary single-crystalline silicon PN junction diodes, and are considered to be unique to polycrystalline silicon.

Figure 2:
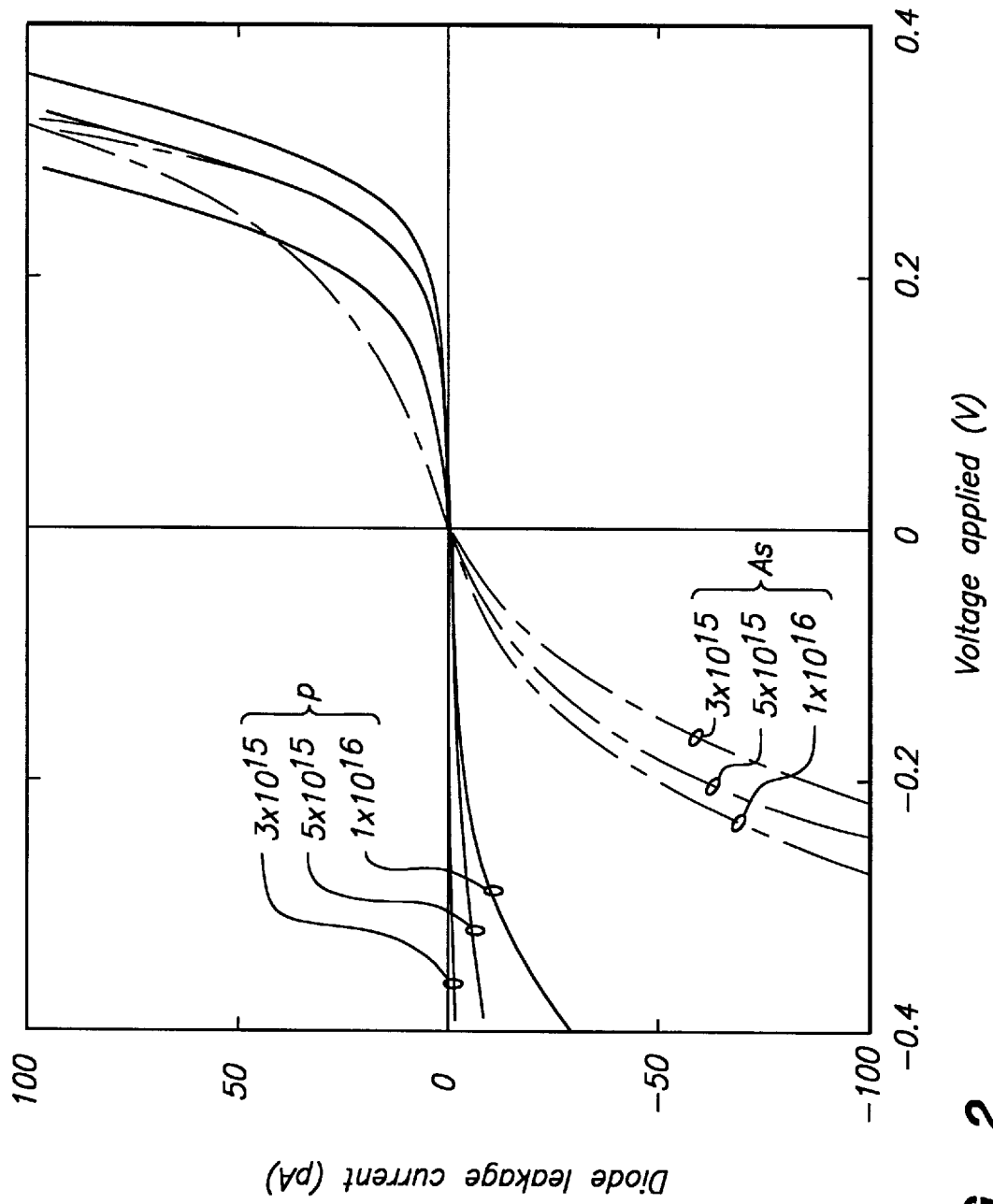
FIG. 2 shows how the voltage and current characteristics of a PN junction diode consisting of polycrystalline silicon changes as the dopant or its density is changed.

FIG. 2 shows an example of actual measurements of the voltage and current characteristics of the polycrystalline silicon PN junction diode shown in FIG. 1.

The figure shows cases in which phosphorus (P) or arsenic (As) is used as the N-type impurity of N-type polycrystalline silicon layer 92.

Phosphorus or arsenic is introduced into the polycrystalline silicon layer through ion implantation. Phosphorous implantation was performed under 35 KeV acceleration voltage energy, and arsenic implantation was performed under 70 KeV acceleration voltage energy. The dose during the ion implantation of both phosphorus and arsenic was varied from $3 \times 10^{15}$ atms/cm$^2$, to $5 \times 10^{15}$ atms/cm$^2$, and to $1 \times 10^{16}$ atms/cm$^2$.

The results showed that larger doses produced larger leakage currents, and that arsenic increased leakage current more than phosphorous. For example, at −0.2 V, FIG. 2 clearly shows that larger leakage current (reverse-direction current) occurred when arsenic was used as the n-type impurity than when phosphorous was used. Therefore, arsenic was determined to be a more preferable impurity than phosphorous.

Furthermore, arsenic doses in the above-described range of between $3 \times 10^{15}$ atms/cm$^2$ and $1 \times 10^{16}$ atms/cm$^2$ turned out to provide stable characteristics curves suitable to obtaining high levels of reverse-direction current. If the dose is lower than $3 \times 10^{15}$ atms/cm$^2$, the resistance of the polycrystalline silicon layer increases abruptly and a huge voltage decline is caused by the interconnection, making it impossible to supply a sufficient amount of current. On the other hand, if the arsenic dose is higher than $1 \times 10^{16}$ atms/cm$^2$, ion implantation time becomes longer, lowering semiconductor device manufacturing efficiency.

FIG. 3 shows the impurity density distribution in the film thickness direction (in the depth direction relative to the surface) after phosphorus (P) and arsenic (As) ions are implanted into a polycrystalline silicon layer using 40 KeV acceleration voltage energy, followed by heat treatment at 900° C. for 30 minutes.

In the figure, the dotted line and the solid line indicate the phosphorous (P) distribution and the arsenic (As) distribution, respectively. The figure shows that the arsenic density is higher than the phosphorous density near the surface of the polycrystalline silicon layer. In other words, the arsenic distribution possesses a peak near the surface.

This is because arsenic has a larger mass number than phosphorous, enabling shallower ion implantation. Arsenic also has a smaller coefficient of dispersion, and thus its dispersion into the polycrystalline silicon layer is more restricted than phosphorous when the heat treatment is applied.

Therefore, a PN junction possessing high and steep density slope can be more readily formed using arsenic as the N-type impurity than using phosphorous. This results in a leakier diode, and thus larger reverse-direction current can be obtained with lower voltage application.

As a result, the supply capacity of a power supply using PN junction reverse-direction current (leakage current) is improved, making it possible to provide a semiconductor device that possesses polycrystalline silicon multi-layer interconnection lines and that is low in power consumption and operation voltage.

In the above example, the impurity density was increased near the junction of thick N-type polycrystalline silicon layer 92. However, the leakage current will increase even further if the impurity density is increased near the junction of thin P-type polycrystalline silicon layer 91.

Boron difluoride (BF$_2$) is preferred to boron (B) as the P-type dopant for ion implantation. Boron difluoride (BF$_2$) has a larger mass number, making focused implantation into the vicinity of the junction easier, as is the case with arsenic (As).

FIG. 4 shows the major area of a second working example of the semiconductor device according to the present invention.

This semiconductor device comprises single-crystalline semiconductor substrate 100, insulation film 110, N+ type first polycrystalline silicon layer 120, first layer insulation film 135, P+ type second polycrystalline silicon layer 130, second insulation film 140, aluminum (AL) electrode 150 for supplying power supply voltage (VDD), load circuit 200*a*, and load circuit 200*b*.

The thickness of N+ type first polycrystalline silicon layer 120 is approximately between 100 and 200 nm, and is 100 nm, for example. As shown on the left side of FIG. 4, arsenic (As) density is made high near the surface of first polycrystalline silicon layer 120. In FIG. 4, reference number 134 indicates a region with high arsenic density. In this figure, region 134 with high arsenic density inside first polycrystalline silicon layer 120 is indicated by dashed lines.

The thickness of P+ type second polycrystalline silicon layer 130 is approximately between 20 and 40 nm, and is 30 nm, for example.

Load circuits 200*a* and 200*b* are connected to P+ type second polycrystalline silicon layer 130.

Current I$_k$ flows through aluminum (AL) electrode 150, first polycrystalline silicon layer 120, PN junction diode 90, and second polycrystalline silicon layer 130. Current I3 and I4 are supplied to load circuits 200*a* and 200*b*, respectively.

Aluminum (AL) electrode 150 cannot be directly connected to the P+ type second polycrystalline silicon layer 130. The reason for this is as follows. Because the P+ type second polycrystalline silicon layer 130 is so thin that when the layer insulation film is etched to form contact holes, second polycrystalline silicon layer 130 is also etched, producing through-holes in the second polycrystalline silicon layer 130 itself.

As explained in the first working example above, the leakage current of reverse-direction diode 90 is large, and thus sufficient current can be supplied to load circuits 200*a* and 200*b* in the present working example as well.

The manufacturing method for the structure shown in FIG. 4 is explained with reference FIG. 5 through FIG. 12.

First, as shown in FIG. 5 (process 1), oxide film 110 is formed by thermally oxidizing the surface of semiconductor substrate 100, and then non-doped first polycrystalline silicon layer 120 is formed. The thickness of first polycrystalline silicon layer 120 is approximately between 100 and 200 nm, and is 100 nm, for example. Oxide film 110 can also be formed using a CVD method.

Next, as shown in FIG. 6 (process 2), arsenic (As) ions are implanted into non-doped first polycrystalline silicon layer 120. The acceleration voltage energy used for ion implantation is from 40 to 70 KeV, and the dose is in the range of $3\times10^{15}$ atms/cm$^2$ to $1\times10^{16}$ atms/cm$^2$. In surface of first polycrystalline silicon layer 120 is increased.

Next, as shown in FIG. 7 (process 3), a pattern is formed on first polycrystalline silicon layer 120. Then, layer insulation film 135 consisting of a thin film with thickness of between 20 and 30 nm is formed using a CVD method in which $SiH_4$ and $O_2$ are reacted with each other.

Then, part of layer insulation film 135 is selectively removed through anisotropic dry etching, forming opening 136. As a result, part of the surface of first polycrystalline silicon layer 120 becomes exposed.

Next, as shown in FIG. 8 (process 4), non-doped second polycrystalline silicon layer 130 is formed. The thickness of second polycrystalline silicon layer 130 is approximately between 20 and 40 nm, and is 30 nm, for example.

Next, as shown in FIG. 9 (process 5), boron difluoride ($BF_2$) ions are implanted into the entire surface of second polycrystalline silicon layer 130. The acceleration voltage energy used for ion implantation is from 30 to 40 KeV, and the dose is in the range of $1\times10^{14}$ atms/cm$^2$ to $1\times10^{15}$ atms/cm$^2$.

Next, as shown in FIG. 10 (process 6), a pattern is formed on second polycrystalline silicon layer 130.

Next, as shown in FIG. 11 (process 7), layer insulation film 140 is formed.

Next, as shown in FIG. 12 (process 8), opening 142 which goes through both first layer insulation film 135 and second layer insulation film 140 is formed, exposing part of the surface of first polycrystalline silicon layer 120.

Next, as in FIG. 4 (process 9), aluminum electrode 150 is formed. Then, load circuits 200a and 200b are connected to second polycrystalline silicon layer 130, completing the semiconductor device.

An SRAM that is one of the working examples (example 3) of the present invention is explained with reference to FIG. 13 through FIG. 23.

Figure 13:
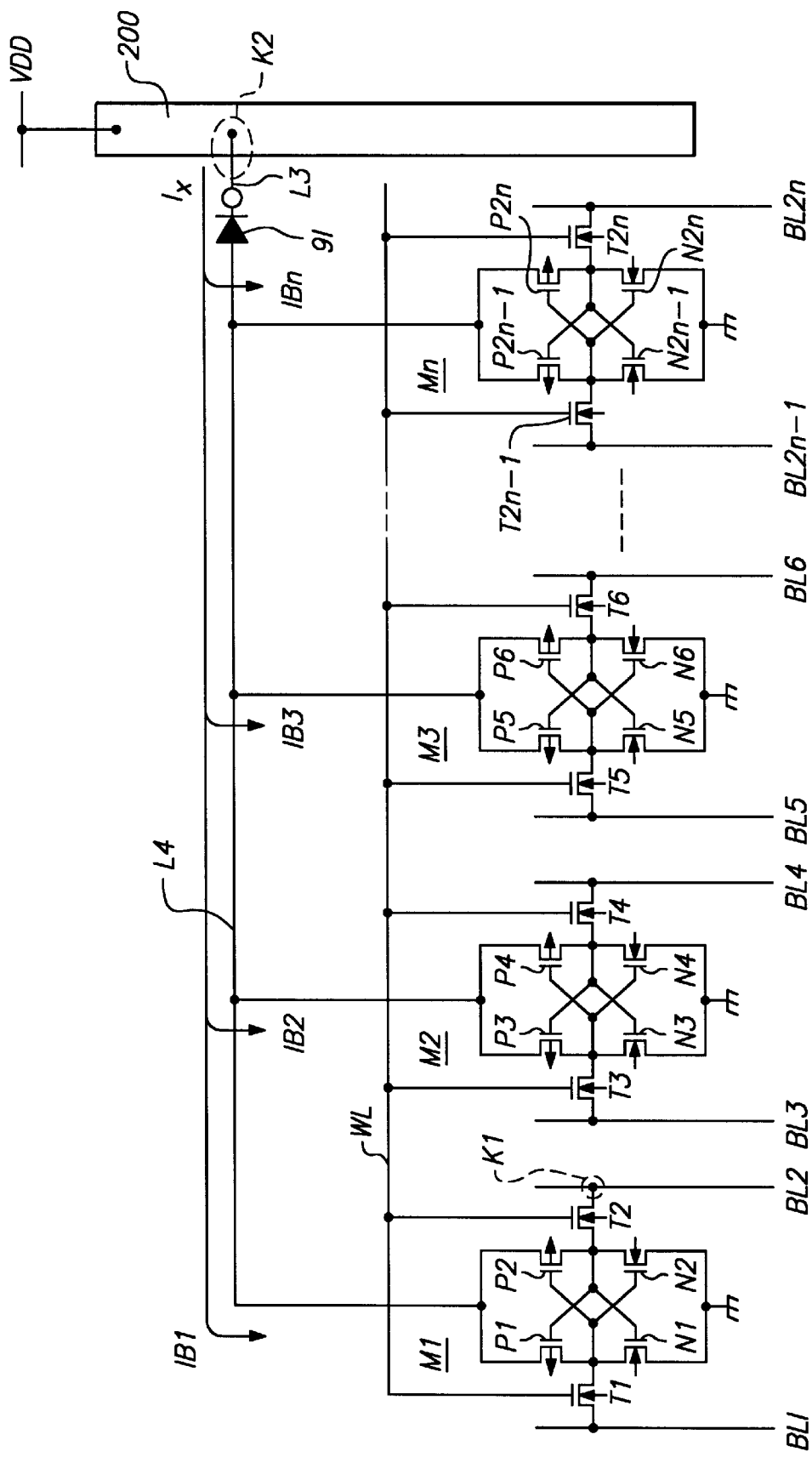
FIG. 13 shows the configuration of the major area of the SRAM which is the second working example of the invention.

As shown in FIG. 13, each cell of the SRAM in this working example comprises two NMOS transistors (N1~N2n) that constitute a flip-flop, two PMOS transistors (P1~P2n) that constitute the load of the flip-flop, and two NMOS transistors (T1~T2n) that constitute a transfer gate.

The gates of individual NMOS transistors (T1~T2n) that constitute transfer gates are connected to common word line WL. The drains of individual NMOS transistors (T1~T2n) that constitute transfer gates are individually connected to corresponding bit lines (BL1~BL2n).

Individual memory cells M1~Mn receive current supply (IB1~IBn) from current line 200 via relay line L3 and common power supply line L4. Reverse-direction diode 91 exists between relay line L3 and common power supply line L4.

Bit lines (BL1~BL2n) and power supply line 200 consist of aluminum (AL).

FIG. 14 shows further details of part of memory cell (M1) shown in FIG. 13 and the structure of the current supply path.

The source of PMOS transistor (P2) which acts as the load for the flip-flop and common line (L4) are connected to power supply line 200 via relay line (L3).

Source (S) of PMOS transistor (P2) and common line (L4) consist of the fourth P+ type polycrystalline silicon layer, and relay line (L3) consists of the third N+ type polycrystalline silicon layer. Therefore, reverse-direction diode 91 is formed at the connection between common line (L4) and relay line (L3).

Bit line (BL2) is connected via relay line (L2) to drain (L1) of NMOS transistor (T2) which constitutes the transfer gate. Drain (L1) of NMOS transistor (T2) consists of an N+ diffusion layer formed inside the semiconductor substrate, and relay line (L2) consists of the third N+ type polycrystalline silicon layer.

It should be noted that bit line (BL2) is connected to NMOS transistor (T2) via relay line (L2) which consists of the third N+ type polycrystalline silicon layer, and likewise power supply line 200 which consists of aluminum is connected to PMOS transistor (P2) via relay line (L3) which consists of the third N+ type polycrystalline silicon layer. In other words, identical connection structures (structures indicated by reference numbers K1 and K2 in FIG. 14) are used between the aluminum lines and the transistors, and this standardization simplifies the manufacturing process.

However, this structural standardization results in the formation of the above-described unwanted reverse-direction diode 91. Therefore, it is necessary to supply sufficient current to each memory cell by increasing leakage current $I_x$ of this reverse-direction diode 91. However, adding a separate process only for increasing leakage current $I_x$ of this reverse-direction diode 91 is undesirable since that will complicate the SRAM manufacturing process. Therefore, in this working example, leakage current $I_x$ of reverse-direction diode 91 is increased using the structure explained in working examples 1 and 2, without complicating the manufacturing process. The use of the structure according to the present invention achieves leakage current $I_x$ in the order of $1\times10^{-11}$ to $1\times10^{-12}$ (A). This level of current is sufficient to supply the current required by the large number of memory cells connected to a single word line.

FIG. 15 shows the layers that constitute a single memory cell in this working example. In this figure, "G" denotes a gate, "S" denotes a source, and "D" denotes a drain. Note that new reference numbers are assigned to some areas of this figure to facilitate better understanding of the manufacturing process described below.

The manufacturing processes for load PMOS transistor (P2), common line (L4), and relay line (L3) shown in FIG. 15 are explained using FIG. 16 and FIG. 17A through FIG. 17D.

FIG. 16 shows the structures of load PMOS transistor (P2), common line (L4), and relay line (L3) as part of a semiconductor device. In this figure, reference number 207 indicates the third polycrystalline silicon layer which becomes the gate (G) of load PMOS transistor (P2). Reference numbers 137 and 139 indicate layer insulation films. Note that the first and second polycrystalline silicon layers are omitted from FIG. 16.

The structure in FIG. 16 is formed through the process described in FIG. 17A through FIG. 17D.

First, as shown in FIG. 17A (process 1), arsenic (As) ions are implanted into non-doped third polycrystalline silicon layer (L3 and 207) that has been formed on layer insulation film 137.

The thickness of polycrystalline silicon layer (L3 and 207) is approximately between 100 and 200 nm, and is 100 nm, for example.

The acceleration voltage energy used for ion implantation is in the range between 40 and 70 KeV, and the dose is in the range of $3 \times 10^{15}$ atms/cm$^2$ to $1 \times 10^{16}$ atms/cm$^2$. This process increases the arsenic density near the surface of polycrystalline silicon layer (L3 and 207).

However, since the third polycrystalline silicon layer is also used as an interconnection layer, the above-mentioned ion implantation must sufficiently lower the resistance of this third polycrystalline silicon layer to enable its use as an interconnection layer. FIG. 24 shows the relationship between the dose applied to the polycrystalline silicon and its sheet resistance. For polycrystalline silicon to be usable as interconnection, its sheet resistance is preferably 0.2 KΩ or lower. Therefore, the data in FIG. 24 indicates that the arsenic (As) dose for the polycrystalline silicon is preferably at least $3 \times 10^{15}$ atms/cm$^2$. If the dose exceeds $1 \times 10^{16}$ atms/cm$^2$, the time required for ion implantation becomes longer and damage will result from the ion implantation. Therefore, the dose is preferably $1 \times 10^{16}$ atms/cm$^2$ or lower.

FIG. 25 shows the relationship between the thickness of the polycrystalline silicon and its sheet resistance. At the dose of $3 \times 10^{15}$ atms/cm$^2$, sheet resistance of 0.2 KΩ or lower is achieved when the thickness of the polycrystalline silicon is around 100 nm.

Next, as shown in FIG. 17B (process 2), layer insulation film 147 with thickness of between 20 and 30 nm is formed on polycrystalline silicon layer (L3 and 207). Then, opening 149 is formed in part of layer insulation film 147.

Next, as shown in FIG. 17C (process 3), polycrystalline silicon layer 167 with thickness of between 20 and 40 nm is formed. Then, phosphorous ions are implanted into the entire surface of polycrystalline silicon layer 167. The acceleration voltage energy is in the range between 30 and 40 KeV, and the dose is in the range of $1 \times 10^{12}$ atms/cm$^2$ to $5 \times 10^{13}$ atms/cm$^2$.

Next, as shown in FIG. 17D (process 4), a photoresist is coated, and then the photoresist is processed using a photolithographic technique, forming masks 169a and 169b. Mask 169a is formed in the channel formation region of load PMOS transistor (P2).

Then, BF$_2$ ions are selectively implanted using ion implantation into polycrystalline silicon layer 167 at 30 to 40 KeV and $1 \times 10^{14}$ atms/cm$^2$ to $1 \times 10^{15}$ atms/cm$^2$. The above process forms the source region (S), drain region (D), and interconnection region of load PMOS transistor (P2).

Next, (process 5) the photoresist that was used as the mask for ion implantation is removed, final protective film 139 is formed, contact holes are formed in part of the final protective film 139, and power supply (VDD) line 200 is formed, completing the structure shown in FIG. 16.

An example of how one of the memory cells shown in FIG. 15 is manufactured is explained with reference to FIG. 18 through FIG. 21.

As shown in FIG. 18 (process 1), insulation gate (G) consisting of polycrystalline silicon is formed on a semiconductor substrate, then an impurity is introduced through ion implantation using this gate (G) and the field oxide (referred to as LOCOS), forming the sources (S) and drains (D) of NMOS transistors N1, N2, T1, and T2. In FIG. 18, reference numbers 1 through 5, 7, and 8 indicate through-holes.

As shown in FIG. 19 (process 2), word line (WL) consisting of the second polycrystalline silicon layer and VSS (GND) line 202 also consisting of the second polycrystalline silicon layer are formed.

As shown in FIG. 20 (process 3), the third and fourth polycrystalline silicon layers are formed, and then load PMOS transistors (TFTs) P1 and P2 are formed using the method explained in FIG. 17A through FIG. 17D. In FIG. 20, reference numbers 5 and 5' indicate through-holes. Reference numbers 6 and 6' also indicate through-holes.

Figure 21:
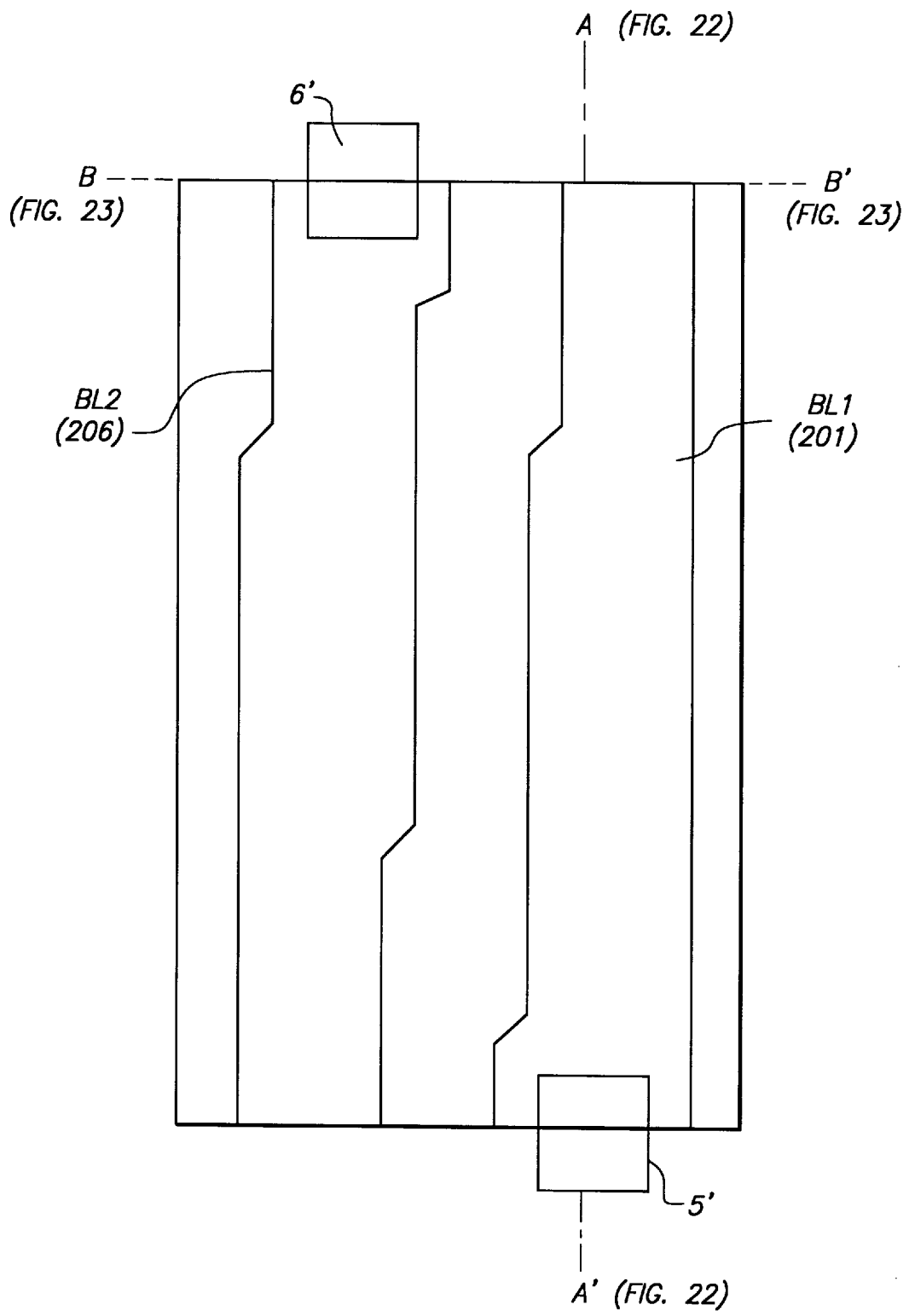

Next, as shown in FIG. 21 (process 4), bit lines BL1 and BL2 consisting of aluminum are formed.

Figure 22:
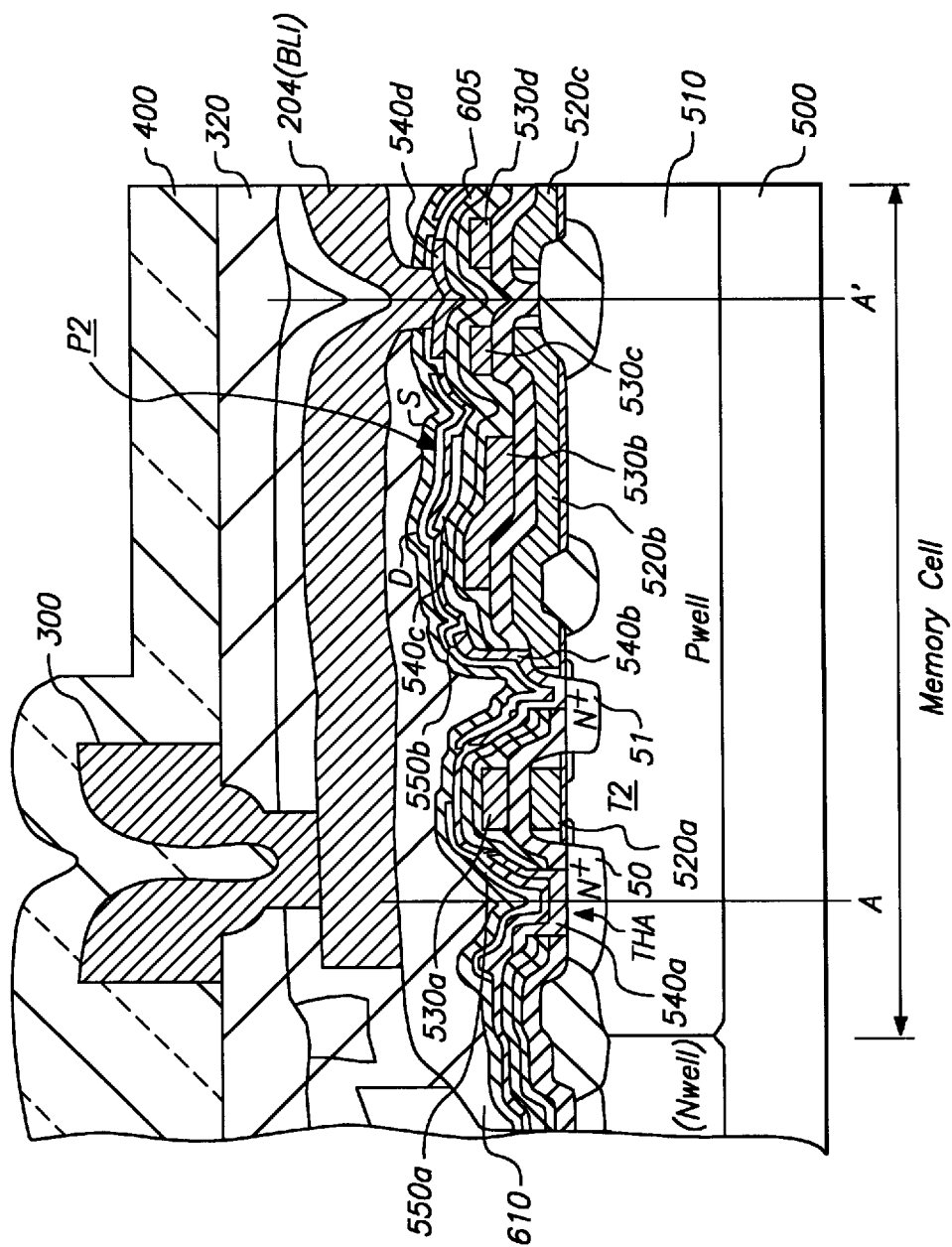
FIG. 22 is a cross-section along line A–A' of the memory cell following the completion of the process shown in FIG. 21.

FIG. 22 and FIG. 23 show a cross-sectional structure of the memory cell following the completion of the process in FIG. 21. FIG. 22 is a cross-section along line A–A' of the memory cell shown in FIG. 21. FIG. 23 is a cross-section along line B–B' of the memory cell shown in FIG. 21. As FIG. 22 and FIG. 23 show, the SRAM in this working example possesses a 6-layer interconnection structure that uses four layers of polycrystalline silicon interconnection and two layers of aluminum interconnection.

As shown in FIG. 22 and FIG. 23, source and drain layers (50 and 51) of NMOS transistor T2 are formed inside P-type well region 510. P-type well region 510 is formed inside semiconductor substrate 500. Furthermore, gate 520a of NMOS transistor T2 comprises the first polycrystalline silicon layer. Reference numbers 520b and 520c indicate lines that consist of the first polycrystalline silicon layer.

Note that reference numbers 530a, 530b, 530c, and 530d indicate the second polycrystalline silicon layer; reference numbers 540a, 540b, 540c, 540d, and 540e indicate the third polycrystalline silicon layer; and reference numbers 550a, 550b, and 550c (FIG. 23) indicate the fourth polycrystalline silicon layer. Reference numbers 320, 605, and 610 indicate layer insulation films; reference number 204 indicates the first aluminum line that constitutes bit line (BL1); reference number 206 (FIG. 23) indicates the first layer aluminum line that constitutes bit line (BL2); and reference number 300 indicates the second layer aluminum line. Reference number 400 is the final protective film. In FIG. 23, "THA" indicates a through-hole for connecting the third polycrystalline silicon layer 540a to diffusion layer 50.

As shown in FIG. 22, the source layer and the drain layer of PMOS transistor (P2) which becomes the load of the flip-flop are formed inside the fourth polycrystalline silicon layer 550b which is extremely thin. The third polycrystalline silicon layer indicated by reference number 540 becomes the gate electrode of PMOS transistor (P2).

FIG. 26A shows another structure (working example 4) that is effective in increasing the leakage current of a PN junction diode consisting of polycrystalline silicon.

In the PN junction diode in FIG. 26A, amorphous layer 750 is provided near the PN junction inside N-type layer 93, to intentionally increase the leakage current. The crystalline characteristics are deteriorated in the PN junction of diode 95 possessing such a structure, thus a high level of leakage current (reverse-direction current) $I_R$ flows as shown in FIG. 26B.

An example of the manufacturing method for the PN junction diode consisting of polycrystalline silicon layers shown in FIG. 26A is explained below with reference to FIG. 27 through FIG. 31.

As shown in FIG. 27 (process 1), insulation film 1100 is formed on a semiconductor substrate 1000, and polycrystalline silicon layer 1200 is then formed on this insulation film 1100. Next, layer insulation 1300 is formed, and then mask 1400 consisting of photoresist is formed. Next, argon (Ar) ions are implanted into part of polycrystalline silicon layer 1200 at a dose of at least $1\times10^{15}$ atms/cm$^2$. This ion implantation causes damage to the crystalline structure of the polycrystalline silicon, forming continuous amorphous layer 1450.

Note that the ion to be implanted is not limited to argon, and the same effects can be obtained using ions of a rare gas such as krypton, oxygen, carbon, or nitrogen, as long as the dose is at least $1\times10^{15}$ atms/cm$^2$. Because the recrystallization speed of amorphous layer 1450 formed through the implantation of these ions is slow, amorphous layer 1450 is maintained for a long time even when heat treatment is applied after ion implantation, and thus is ideal for increasing leakage current. The same effects can be obtained by implanting ions with a larger mass number, such as arsenic, as long as the dose is at least $1\times10^{15}$ atms/cm$^2$.

As shown in FIG. 28 (process 2), opening 1500 is formed by removing part of layer insulation 1300.

As shown in FIG. 29 (process 3), non-doped polycrystalline silicon layer 1600 is formed on layer insulation 1300 and patterned. Next, boron difluoride (BF$_2$) ions are selectively implanted into non-doped polycrystalline silicon layer 1600, forming a P-type layer. This P-type layer becomes the source layer, the drain layer, or the interconnection layer of the thin film transistor (TFT).

Next, as shown in FIG. 30 (process 4), final protective film 1800 is formed, and a contact hole is formed by removing part of this final protective film 1800. Then, aluminum electrode 1700 is formed. The cross section of the semiconductor device manufactured by this method is shown in FIG. 31.

The method in this working example described above can produce a semiconductor device possessing the same multilayer structure as that shown in FIG. 16.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device comprising:
   a first insulation layer provided on a semiconductor substrate;
   an N-type first polycrystalline silicon layer that is formed on said first insulation layer, having a certain thickness, and comprising selective parts of a surface that are amorphous;
   a second insulation layer that is formed on said first polycrystalline silicon layer, and comprising openings provided in locations that correspond to the selective parts of said first polycrystalline silicon layer that are amorphous;
   a P-type second polycrystalline silicon layer that is formed on said second insulation layer, that is connected to said first polycrystalline silicon layer through said openings, and that is thinner than said first polycrystalline silicon layer;
   a third insulation layer formed on said second polycrystalline silicon layer;
   an opening formed through both said second and third insulation layers;
   a conductive layer that is formed on said third insulation layer, and that is connected to said first polycrystalline silicon layer through said opening formed through both said second and third insulation layers; and
   a load circuit that is electrically connected to said second polycrystalline silicon layer; and
   wherein current is supplied from the conductive layer to the load circuit via a reverse-direction junction diode formed by said first and said second polycrystalline silicon layers.

2. A semiconductor device comprising:
   multiple pairs of bit lines;
   multiple memory cells that are connected between the individual pairs of bit lines and are driven by a common word line;
   a power supply line for supplying power supply voltage to said multiple memory cells;
   a common current path that is connected to said power supply line and that supplies current to said multiple memory cells;
   a reverse-direction diode within said common current path; and
   an interconnection layer that connects said common current path with said memory cells; and
   wherein one of the memory cells comprises:
     a pair of N-type insulation gate field effect transistors that constitute a flip-flop;
     a pair of N-type insulation gate field effect transistors that constitute a transfer gate provided between two output terminals of said flip-flop and a pair of bit lines; and
     a pair of P-type insulation gate field effect transistors that constitute a load of said flip-flop and that are provided between a common connection point between the output terminals of said flip-flop and the insulation gate field effect transistors that constitute said transfer gate, and the power supply line; and
   wherein a source layer and a drain layer of the pair of N-type insulation gate field effect transistors that constitute said flip-flop, and a source layer and a drain layer of the pair of N-type insulation gate field effect transistors that constitute said transfer gate are impurity layers formed inside a semiconductor substrate;
   wherein the source (S) and the drain (D) of the pair of P-type insulation gate field effect transistors that constitute the load of said flip-flop comprise an n-th P-type polycrystalline silicon layer, where n is an integer of at least 2, formed on a semiconductor substrate, and said n-th P-type polycrystalline silicon layer that exists continuously to said source (S) acts both as an interconnection between said common current path and each of said memory cells and as an interconnection that constitutes part of said common current path;
   wherein said pair of bit lines and said common current path are located in conductive layers both of which are higher than said n-th polycrystalline silicon layer;
   wherein said pair of bit lines and the drain layer of the N-type insulation gate field effect transistors that constitute said transfer gate are mutually connected by the first relay line that is formed using the (n−1)-th N-type polycrystalline silicon layer:
   wherein the n-th P-type polycrystalline silicon layer that acts as said interconnection and said common current path are mutually connected by a second relay line that is formed using the (n−1)-th N-type polycrystalline silicon layer, and thus forming a reverse-direction diode within said common current path;

wherein the thickness of said (n−1)-th N-type polycrystalline silicon layer that constitutes said second relay line is thicker than the thickness of said n-th P-type polycrystalline silicon layer that acts as said interconnection; and wherein the density distribution of N-type impurities in the thickness direction in the region, in which said reverse-direction diode is formed of the (n−1)-th N-type polycrystalline silicon layer that constitutes said second relay line peaks near the function of said reverse-direction diode; and wherein said N-type impurity for said (n−1)-th N-type polycrystalline silicon layer that constitutes said second relay line comprises arsenic (As) introduced through ion implantation; and wherein an acceleration speed used for implanting arsenic (As) ions into said (n−1)-th N-type polycrystalline silicon layer that constitutes said second relay line is in a range between 40 and 70 KeV, and the dose is in a range of $3 \times 10^{15}$ atms/cm$^2$ to $1 \times 10^{16}$ atms/cm$^2$.

3. A semiconductor device according to claim 2 wherein the thickness of said (n−1)-th N-type polycrystalline silicon layer that constitutes said second relay line is in a range of 100 to 200 nm, and the thickness of said n-th P-type-polycrystalline silicon layer that acts as said interconnection is equal to or less than one half the thickness of said (n−1)-th N-type polycrystalline silicon layer that constitutes said second relay line.

* * * * *